United States Patent
Dasgupta et al.

(10) Patent No.: US 10,431,717 B1
(45) Date of Patent: Oct. 1, 2019

(54) LIGHT-EMITTING DIODE (LED) AND MICRO LED SUBSTRATES AND METHODS FOR MAKING THE SAME

(71) Applicant: Intel Corporation, Santa Clara, CA (US)

(72) Inventors: Sansaptak Dasgupta, Hillsboro, OR (US); Marko Radosavljevic, Portland, OR (US); Han Wui Then, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/940,440

(22) Filed: Mar. 29, 2018

(51) Int. Cl.
| | |
|---|---|
| *H01L 33/20* | (2010.01) |
| *H01L 33/32* | (2010.01) |
| *H01L 33/00* | (2010.01) |
| *H01L 33/10* | (2010.01) |
| *H01L 33/08* | (2010.01) |

(52) U.S. Cl.
CPC .......... *H01L 33/20* (2013.01); *H01L 33/0025* (2013.01); *H01L 33/0075* (2013.01); *H01L 33/08* (2013.01); *H01L 33/10* (2013.01); *H01L 33/325* (2013.01)

(58) Field of Classification Search
CPC combination set(s) only.
See application file for complete search history.

(56) References Cited

U.S. PATENT DOCUMENTS

| | | | |
|---|---|---|---|
| 2008/0213982 A1* | 9/2008 | Park | H01L 21/76254 438/480 |
| 2012/0061646 A1* | 3/2012 | Yi | H01L 33/24 257/13 |
| 2015/0090955 A1* | 4/2015 | Park | H01L 33/0025 257/13 |

* cited by examiner

*Primary Examiner* — Ratisha Mehta
(74) *Attorney, Agent, or Firm* — Green, Howard & Mughal LLP

(57) ABSTRACT

Micro LED displays offer brighter screens and wider color gamuts than that achievable using traditional LED or OLED displays. Various embodiments are directed to LED and micro LED structures having substrates comprising a metal and oxygen, such as gallium and oxygen, and methods of forming the same. An integrated circuit (IC) structure can include a substrate comprising a metal and oxygen and a core over the substrate. The core can include a group III semiconductor material and nitrogen, and the core can be doped with n-type or p-type dopants. An active layer comprising indium can be provide on a surface of the core. The indium concentration can be adjusted to tune a peak emission wavelength of the IC structure. The IC structure can include a cladding on a surface of the active layer. The cladding can be doped with dopants of opposite type than those used to dope the core.

17 Claims, 18 Drawing Sheets

LIGHT-EMITTING DIODE (LED) AND MICRO LED SUBSTRATES AND METHODS FOR MAKING THE SAME

TECHNICAL FIELD

The present disclosure generally relates to light-emitting diodes (LEDs) and micro LED devices. More specifically, the present disclosure relates to LED and micro LED substrates.

BACKGROUND

A light emitting diode (LED) is a two-lead semiconductor light source. More simply, LEDs are essentially p-n junction diodes that emit light when activated. This effect is called electroluminescence, and the color of the light emitted is determined by the energy band gap of the semiconductor material. Traditional LEDs are typically of a size on the order of hundreds of microns. In contrast, micro-sized LEDs or micro LEDs are of a size on the order of tens of microns or less. Micro LED displays can provide brighter screens and wider color gamuts than that achievable using traditional LED or organic LED (OLED) displays.

Micro LEDs are an emerging technology area, and demand for micro LED-based technology platforms in devices such as consumer wearables (for example, watches, augmented reality devices, virtual reality devices) and mobile or stationary display devices is increasing rapidly. Such devices may require a full color range, high brightness (for example, more than 2,000 cd/m$^2$), high contrast, low power requirements, high pixel densities (for example, more than 2,500 pixels per inch), and low manufacturing costs.

To make active matrix micro LED display panels capable of satisfying these requirements, many workflows produce individual micro LEDs that are tuned to emit red, green or blue colors on separate wafers. These micro LEDs are then transferred from the original wafers to thin film transistor (TFT) backplanes to make red, green, and blue (RGB) pixels that make up the active matrix LED display panel. In other words, conventional micro LEDs may be made up of micron sized digital components formed on appropriate substrates, separated from those substrates, and then placed together on one new substrate.

BRIEF DESCRIPTION OF THE FIGURES

Reference will now be made to the accompanying drawings, which are not necessarily drawn to scale, and wherein.

DETAILED DESCRIPTION

Figure 1:
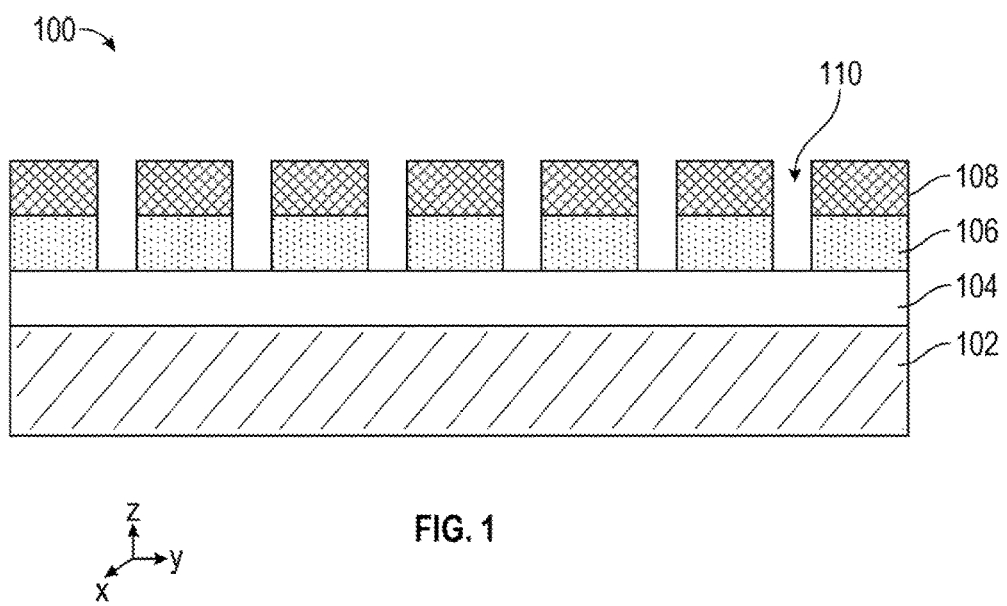
FIG. 1 shows a partial structure of a semiconductor structure during the fabrication of a micro LED device, in accordance with one or more example embodiments of the disclosure.

Embodiments of the disclosure are described more fully hereinafter with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the disclosure to those skilled in the art. Like numbers refer to like, but not necessarily the same or identical, elements throughout.

The following embodiments are described in sufficient detail to enable at least those skilled in the art to understand and use the disclosure. It is to be understood that other embodiments would be evident based on the present disclosure and that process, mechanical, material, dimensional, process equipment, and parametric changes may be made without departing from the scope of the present disclosure.

In the following description, numerous specific details are given to provide a thorough understanding of various embodiments of the disclosure. However, it will be apparent that the disclosure may be practiced without these specific details. In order to avoid obscuring the present disclosure, some well-known system configurations and process steps may not be disclosed in full detail. Likewise, the drawings showing embodiments of the disclosure are semi-diagrammatic and not to scale and, particularly, some of the dimensions may be exaggerated in the drawings for the clarity of presentation. In addition, where multiple embodiments are disclosed and described as having some features in common, for clarity and ease of illustration, description, and comprehension thereof, similar and like features will ordinarily be described with like reference numerals even if the features are not identical.

The term "horizontal" as used herein may be defined as a direction parallel to a plane or surface (for example, surface of a substrate), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to a horizontal plane, where the horizontal plane can include an x-y plane, a x-z plane, or a y-z plane, as the case may be. The terms "on," "over," "above," "higher," "positioned on," or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary elements at the interface between the two elements. The term "processing" as used herein includes deposition of material or photoresist, patterning, exposure, development, etching, cleaning, ablating, polishing, and/or removal of the material or photoresist as required in formation of a described structure.

"An embodiment," "various embodiments," and the like indicate embodiment(s) so described may include particular features, structures, or characteristics, but not every embodiment necessarily includes the particular features, structures, or characteristics. Some embodiments may have some, all, or none of the features described for other embodiments. "First," "second," "third," and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment.

The terms "perpendicular," "orthogonal," "coplanar," and/or "parallel" may mean substantially perpendicular, orthogonal, coplanar, or parallel, respectively. For example, "perpendicular" can mean perpendicular within ±20, 15, 10, or 5 degrees. Further, the figures shown herein may not have precisely vertical or horizontal edges, but rather may have some finite slope and have surface roughness, as is to be expected for fabricated devices. The terms "about," "substantially," "approximately," and variations thereof, are intended to include a degree of error associated with a measurement of the particular quantity using equipment available at the time of filing the application. For example, "about" can include a range of ±8% or 5%, or 2% of a given value.

The phrase "selective to," such as, for example, "etching a first element selective to a second element," means that the first element is etched while the second element serves as an etch stop. The term "conformal," such as, for example, "forming a conformal layer," means that the deposited or otherwise formed thickness of the layer is substantially the same on all surfaces, or that the thickness variation is less than 15%, 10%, or 5% of the nominal thickness of the layer.

The terms "epitaxy" and "epitaxial growth" refer to the growth of a crystalline material on a surface of another crystalline material. During an epitaxial growth, a crystalline overlayer (the semiconductor material being grown) forms on the surface of a seed material (known as the deposition surface). In an epitaxial deposition process, the overlayer can have substantially the same crystalline characteristics as the seed material. For example, an epitaxially grown semiconductor material deposited on a crystalline surface having Miller indices of {111} can take on a {111} crystalline orientation. Epitaxial growth can be selective to forming on a semiconductor surface, and may or may not deposit material on other exposed surfaces, such as a silicon dioxide or silicon nitride surface.

As discussed previously herein, micro LEDs represent a class of LED display technology that can provide brighter screens and wider color gamuts than that achievable using traditional LED or OLED displays. There are challenges, however, in fabricating micro LED architectures. One such challenge is the difficulty in fabricating micro LEDs on a substrate that is both transparent and highly conductive. A transparent substrate allows light extraction from multiple directions (for example, through substrate), greatly improving luminescence efficiency. A highly conductive substrate allows for the straightforward integration of display driver circuits directly onto the substrate surface, decreasing display module footprints and simplifying the fabrication process.

Many micro LED substrates include sapphire, silicon carbide, and silicon, and each represents a tradeoff between transparency and conductivity. For example, sapphire substrates are transparent, but not conductive, while silicon substrates are conductive, but not transparent. Similarly, silicon carbide substrates are more transparent than silicon substrates, but are less conductive than silicon substrates. Consequently, many LED and microLED substrates require additional processing, such as layer transfer, bonding, or thinning, prior to the integration of device circuitry. A further complication found with some micro LED substrates is the relatively large lattice mismatch between these conventional substrates and desirable micro LED core layer materials (for example, GaN). Lattice mismatches are a source of manufacturing defects, and result in decreased yields and increased manufacturing costs and complications. Consequently, some micro LED fabrication workflows may attempt to mitigate this inherent disadvantage by using one or more relatively thick buffer layers, further complicating workflows and increasing the design footprint. The buffer layers are formed between the sapphire, silicon carbide, or silicon substrate and the core layer and serve to minimize lattice defects by either providing a material having an intermediary lattice constant or by providing a material on which the desired core layer can readily grow without defects (or with fewer defects).

Turning now to aspects of the present disclosure, various embodiments described herein provide novel micro LED structures and fabrication methods for forming the same. The micro LED structures described herein include novel substrates formed from metal oxides, such as, for example, gallium oxide ($Ga_2O_3$). Advantageously, the micro LED substrates described herein are both transparent and highly conductive. Moreover, while a buffer layer can be used to further decrease defects, these substrates do not require a buffer layer for core layers comprising III-N semiconductor materials, as the corresponding lattice mismatches are relatively small as compared to conventional sapphire, silicon carbide, and silicon substrates. III-N semiconductor materials include those materials that are formed by combining group III elements (for example, Al, Ga, In) with nitrogen. For example, some III-N semiconductor materials can include, but are not be limited to, GaN, InN, and their alloys, such as AlGaN, InGaN, InAlGaN.

The micro LED structures described herein can include any number of micro LED components monolithically grown on the same substrate, where each component includes a core, a cladding, and an active layer formed between the core and the cladding. The active layer, also known as an active emitting region, or quantum well, is tuned for each component to produce a specific peak emission wavelength (for example, color). In this manner, LED components can be fabricated to produce any desired color, such as, for example, yellow, green, red, and blue. In some embodiments, these components are grouped into pixel banks (or simply, "pixels"), where each pixel bank includes a component for each color produced in a given application (for example, BGR, BYR, or BGRY).

The active layer can be tuned by adjusting its atomic composition. For example, an active layer comprising indium gallium nitride (InGaN) can be tuned to produce different colors by adjusting the atomic concentration of indium in the active layer. The indium concentration can be adjusted using known techniques, such as in-situ epitaxy, ion implantation, and plasma doping. Alternatively, increasing the core diameter may shift the peak emission wavelength monotonically towards a longer wavelength (for example, from blue to red).

While the micro LED structures illustrated in FIGS. 1-16 depict various micro LED structures having a particular number of components, it is understood that micro LED structures having any desired number of components can be produced according to one or more embodiments of the disclosure. Moreover, the specific arrangement of components (for example, BGRBGR) is but one possible arrangement of components. It is understood that the components can be arranged in any desired fashion, and components producing different colors can be separated (for example, RRRR GGGG), intermixed (for example, RYGRRBGY), or arranged into pixel banks (for example, BGR BGR) as required for a given application. Finally, while the micro LED structures illustrated in FIGS. 1-12 depict a structure having three types of components (for example, blue, green, and red), it is understood that structures having any number of base component types can be produced. For example, structures having two types, such as yellow and blue, four types, such as blue, green, red, and yellow, and five types, such as blue, green, red, yellow, and white, can be provided in one or more embodiments. The simplified drawings are merely provided for ease of illustration and discussion.

FIG. 1 depicts a cross-sectional view of a semiconductor structure 100 in accordance with one or more example embodiments of the disclosure. In one embodiment, the semiconductor structure 100 can include a substrate 102. In one embodiment, the substrate 102 can refer to a solid, substantially planar substance onto which a layer of another substance is applied, and to which that second substance adheres. In one embodiment, the substrate 102 includes a metal oxide, such as, for example, gallium oxide ($Ga_2O_3$). In one embodiment, the substrate 102 includes a crystalline structure having Miller indices of {111}. A {111} orientated crystalline structure is closely compatible to the hexagonal structure of some III-N materials, such as, for example, GaN. In this manner, lattice mismatch (the spacing between atoms) between the substrate 102 and the active layer (to be discussed further herein), and consequently, lattice defects, can be reduced. The substrate 102 can include other crystalline structure orientations, for example, a {100} orientated crystalline surface, and these other orientations are within the contemplated scope of the disclosure. In one embodiment, the substrate 102 includes a buried oxide layer (not depicted). The buried oxide layer can be made of any suitable dielectric material, such as, for example, a silicon oxide. In one embodiment, the substrate 102 may be doped with n-type dopants (for example, phosphorus, arsenic, or antimony) or p-type dopants (for example, boron, gallium, $BF_2$, or aluminum), to increase the conductivity of the substrate 102. The substrate 102 can be doped using a variety of methods, such as, for example, in-situ doped epitaxy, doped following the epitaxy, or by implantation and plasma doping. In one embodiment, the substrate 102 comprises n-doped $Ga_2O_3$. In one embodiment, only a thin topmost layer of the substrate 102 may be doped (not depicted). In one embodiment, this topmost layer can be homoepitaxially grown $Ga_2O_3$.

In one embodiment, a semiconductor layer 104 may be formed on the substrate 102. The semiconductor layer 104 can serve as a buffer between the substrate 102 and the core (to be discussed later), further reducing defects. In one embodiment, the semiconductor layer 104 may be epitaxially grown on the substrate 102 using physical vapor deposition (PVD), chemical vapor deposition (CVD), metal organic chemical vapor deposition (MOCVD), molecular beam epitaxy (MBE) and/or atomic layer deposition (ALD), and the like. The semiconductor layer 104 can be epitaxially grown from gaseous or liquid precursors. The semiconductor layer 104 can be made of any III-N material suitable for micro LED cores, such as, for example, gallium nitride (GaN). In one embodiment, the semiconductor layer 104 may be epitaxially grown on the substrate 102 using a planar epitaxy process. In one embodiment, the semiconductor layer 104 may be doped with silicon. In one embodiment, the semiconductor layer 104 may be silicon doped GaN. As discussed previously herein, the substrate 102 can include a crystalline structure having Miller indices of {111}. Accordingly, in one embodiment, planar epitaxy results in a semiconductor layer 104 having a {111} orientated crystalline structure. Such configurations are well-suited to the hexagonal structure of GaN, and result in a reduction in strain and lattice defects. In one embodiment, the semiconductor layer 104 can be epitaxially grown to a height ranging from 50 nm to 5 μm or more, for example, 100 nm, although other heights are within the contemplated scope of the disclosure.

In one embodiment, a reflective coating 106 may be formed on the semiconductor layer 104. Alternatively, in other embodiments the reflective coating 106 may be formed directly on the substrate 102 (for example, in embodiments where the semiconductor layer 104 is not formed). The reflective coating 106 can be made of any suitable reflective material, such as, for example, silver. The reflective coating 106 serves to reflect stray emissions back towards a preferred light path (for example, away from the substrate 102), increasing the luminescence efficiency of the semiconductor structure 100. In one embodiment, the reflective coating 106 can be deposited, plated, or otherwise formed to a height ranging from 5 nm to 100 nm or more, for example, 10 nm, although other heights are within the contemplated scope of the disclosure.

The semiconductor structure 100 can be electrically isolated from other regions of the substrate 102 by an isolation structure 108. The isolation structure 108 (also referred to as a shallow trench isolation) can be made of any material suitable to insulate adjacent devices and prevent current leakage. The isolation structure 108 can provide one or more field isolation regions that may isolate one component, or one pixel bank, from other, adjacent components or pixel banks. In one embodiment, the isolation structure 108 can include an oxide layer (for example, silicon dioxide), or any other electrically insulating layer. In one embodiment, the isolation structure 108 can include an interlayer dielectric (ILD), such as silicon dioxide. In one embodiment, the isolation structure 108 may include polyimide, epoxy, photodefinable materials (for example, benzocyclobutene), WPR-series materials, and/or spin-on-glass. In one embodiment, the isolation structure 108 can include a low permittivity (low-k) ILD layer. In one embodiment, low-k can refer to dielectrics having a dielectric constant (permittivity k) lower than the permittivity of silicon dioxide. In one embodiment, a thickness of the isolation structure 108 can be approximately 10 nm to approximately 300 nm, with an example thickness of approximately 30 nm to approximately 50 nm. In one embodiment, the isolation structure 108 can be deposited using PVD, CVD, MOCVD, MBE, and/or ALD, and the like.

In one embodiment, the isolation structure 108 and the reflective coating 106 are patterned with one or more trenches 110, each of the trenches 110 exposing a surface of the semiconductor layer 104 (or, in embodiments where the semiconductor layer 104 is not formed, a surface of the substrate 102). The isolation structure 108 and the reflective coating 106 can be patterned using nanoimprint lithography (NIL), or any other suitable process for creating nanometer scale trenches or cavities. In one embodiment, the isolation structure 108 and the reflective coating 106 are patterned with trenches 110 having a width of about 50 nm to 5 μm or more, although other widths are within the contemplated scope of the disclosure. The pitch, or centerline-to-centerline spacing, between the trenches 110 can be 100 nm to 5 μm or more, for example 500 nm, although other trench pitches are within the contemplated scope of the disclosure.

Figure 2:
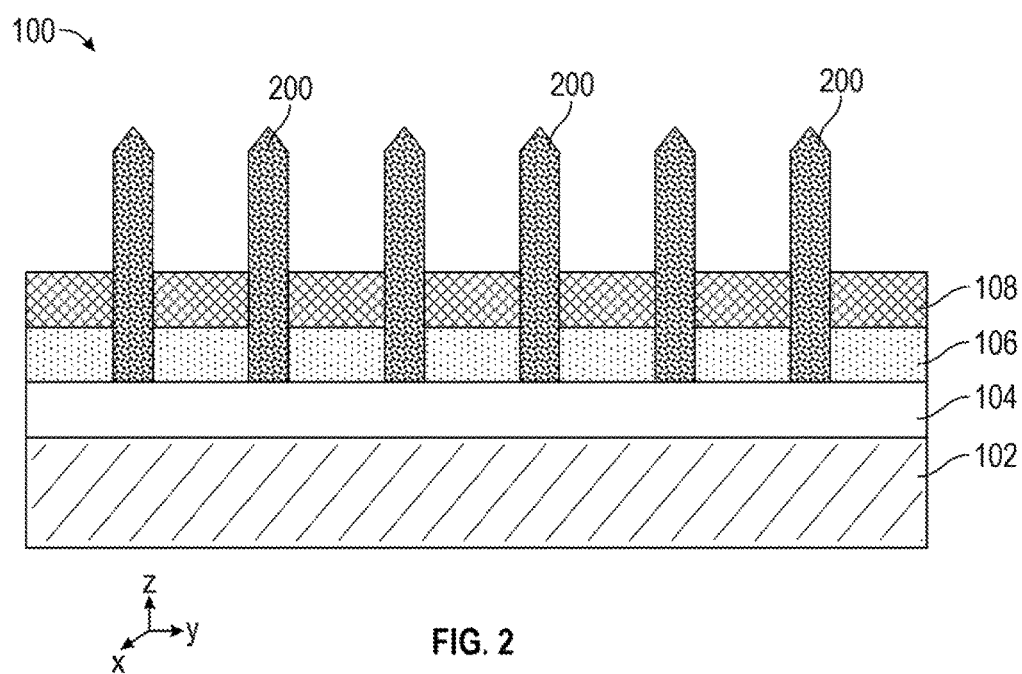
FIG. 2 shows a partial structure of a semiconductor structure during the fabrication of a micro LED device, in accordance with one or more example embodiments of the disclosure.

FIG. 2 depicts a cross-sectional view of the semiconductor structure 100 in accordance with one or more example embodiments of the disclosure. In one embodiment, a core of one or more cores 200 may be formed in each of the trenches 110 on an exposed surface of the semiconductor layer 104 or substrate 102. While referred to as simply as "cores" throughout this disclosure for ease of discussion, the cores 200 can also be referred to as nanowires, nanopillars, or nanorods, depending on the application and the physical dimensions of the core (for example, cores having a high aspect ratio are often referred to as nanopillars). In one embodiment, the cores 200 are epitaxially grown using PVD, CVD, MOCVD, MBE and/or ALD, and the like. In one embodiment, a core of the cores 200 may be selectively grown in each of the trenches 110. The cores 200 can be epitaxially grown from gaseous or liquid precursors. The cores 200 can be made of any III-N material suitable for micro LED cores, such as, for example, gallium nitride (GaN). In one embodiment, the cores 200 are epitaxially grown using a planar epitaxy process. As discussed previously herein, the substrate 102 and the semiconductor layer 104 can include a crystalline structure having Miller indices of {111}. Accordingly, in one embodiment, planar epitaxy results in cores 200 having a {111} orientated crystalline structure. As discussed previously herein, such configurations are well-suited to the hexagonal structure of GaN, and result in a reduction in strain and lattice defects. In one embodiment, the cores 200 can be epitaxially grown to a height of 100 nm to 3 μm or more, as measured above a top surface of the isolation structure 108. For example, the cores 200 can have a high of 150 nm, although other core heights are within the contemplated scope of the disclosure.

As discussed previously herein, a micro LED acts as a p-n junction diode that emits light when activated. Accordingly, the cores 200 can be doped with n-type dopants (for example, phosphorus, arsenic, or antimony) or p-type dopants (for example, boron, gallium, $BF_2$, or aluminum), so long as the cladding, which completes the p-n junction, is formed with a material having an opposite doping type. In one embodiment, the cores 200 are n-type cores. In one embodiment, the cores 200 include n-doped GaN. In one embodiment, the cores 200 are p-type cores, for example, p-doped GaN. The cores 200 can be doped using a variety of methods, such as, for example, in-situ doped epitaxy, doped following the epitaxy, or by implantation and plasma doping. In one embodiment, the dopant concentration in the cores 200 can range from $1 \times 10^{19}$ cm$^{-3}$ to $2 \times 10^{21}$ cm$^{-3}$, for example, $1 \times 10^{20}$ cm$^{-3}$, although other dopant concentrations are within the contemplated scope of the disclosure.

Figure 3:
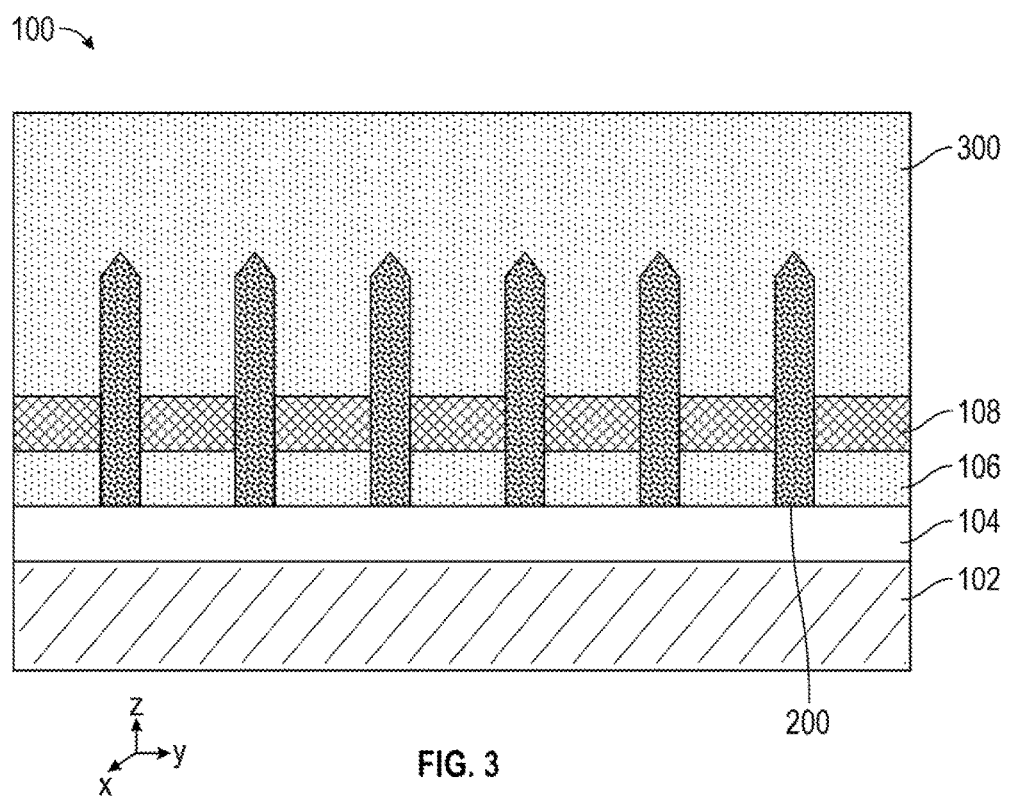
FIG. 3 shows a partial structure of a semiconductor structure during the fabrication of a micro LED device, in accordance with one or more example embodiments of the disclosure.

FIG. 3 depicts a cross-sectional view of the semiconductor structure 100 in accordance with one or more example embodiments of the disclosure. In one embodiment, the semiconductor structure 100 can include a hard mask 300. The hard mask 300 can be made of any suitable hard mask material, such as, for example, $Si_3N_4$, SiON, SiC, SiOCN, SiBCN, or the like. The hard mask 300 can be deposited over the semiconductor structure 100 using PVD, CVD, MOCVD, MBE and/or ALD, and the like. The hard mask 300 can be formed or deposited to a height ranging from 5 nm to 100 nm or more, as measured above a topmost surface of the cores 200, although other heights are within the contemplated scope of the disclosure.

Figure 4:
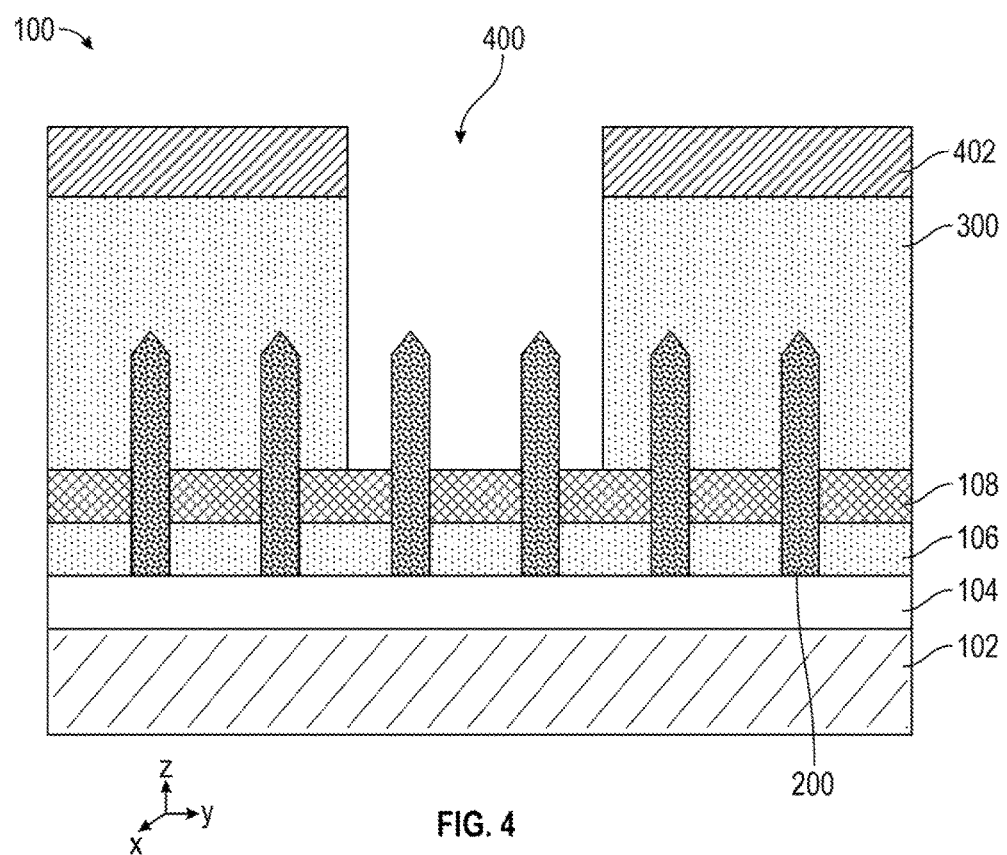
FIG. 4 shows a partial structure of a semiconductor structure during the fabrication of a micro LED device, in accordance with one or more example embodiments of the disclosure.

FIG. 4 depicts a cross-sectional view of the semiconductor structure 100 in accordance with one or more example embodiments of the disclosure. In one embodiment, the hard mask 300 can be patterned with a trench 400. The trench 400 exposes a surface of one or more of the cores 200. The hard mask 300 can be patterned using any suitable technique. In one embodiment, the hard mask 300 may be patterned using a photoresist 402 (or mask) formed over the hard mask 300. The photoresist 402 can be removed after transferring the photoresist 402 pattern into the hard mask 300. As depicted, the hard mask 300 may be patterned to expose two adjacent cores. It is understood, however, that the hard mask 300 can be patterned to expose any combination of the cores 200, adjacent or otherwise.

Figure 5:
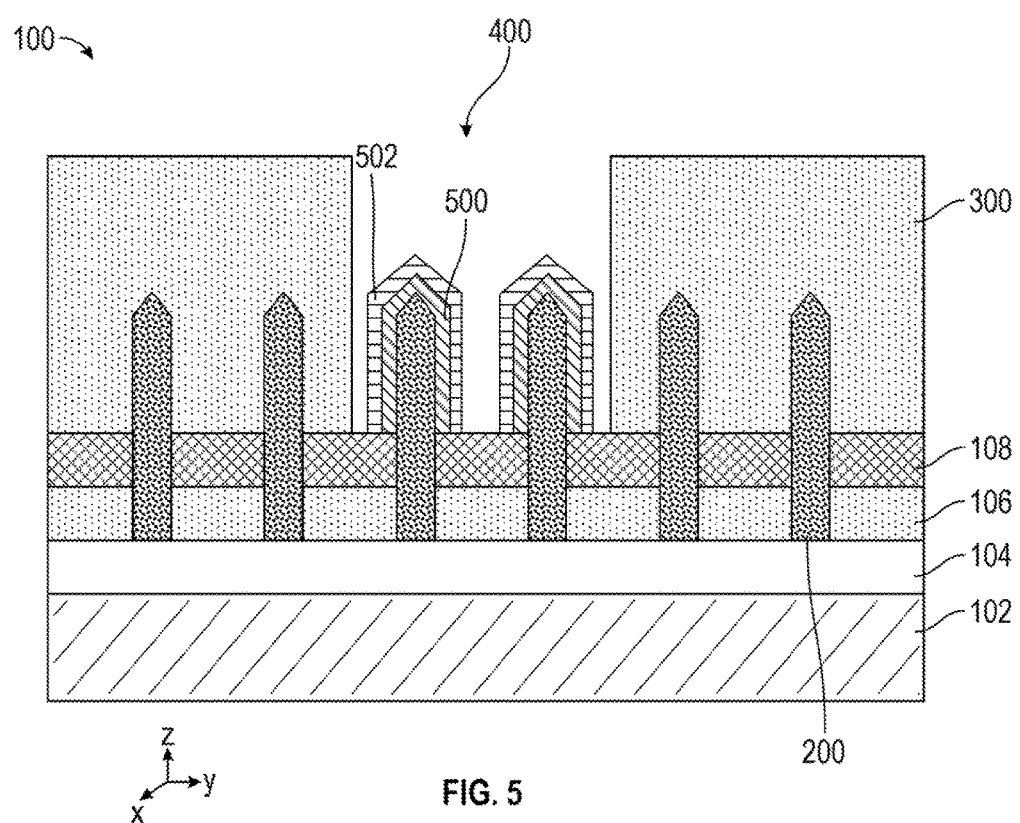
FIG. 5 shows a partial structure of a semiconductor structure during the fabrication of a micro LED device, in accordance with one or more example embodiments of the disclosure.

FIG. 5 depicts a cross-sectional view of the semiconductor structure 100 in accordance with one or more example embodiments of the disclosure. As depicted in FIG. 5, a first active layer 500 and a cladding 502 can be conformally formed over the one or more cores of the cores 200 exposed in the trench 400. As discussed previously herein, an active layer can be tuned to produce a specific peak emission wavelength (for example, color) by adjusting its atomic composition. In one embodiment, the first active layer 500 comprises InGaN having a first indium atomic concentration. In one embodiment, the first indium atomic concentration is about 5 to 10 percent, suitable for blue emission. In one embodiment, the first indium atomic concentration is about 20 to 25 percent, suitable for green emission. In one embodiment, the first indium atomic concentration is about 30 to 40 percent, suitable for red emission. In other embodiments, the first indium atomic concentration may be adjusted between about 5 to about 50 percent, depending on the specific peak emission wavelength desired. The first active layer 500 can be epitaxially grown on one or more cores of the cores 200 using PVD, CVD, MOCVD, MBE and/or ALD, and the like. In one embodiment, the first active layer 500 can be epitaxially grown to a height ranging from 10 nm to 200 nm or more, for example, 100 nm, although other heights are within the contemplated scope of the disclosure.

In one embodiment, the cladding 502 may be conformally formed over the first active layer 500. In one embodiment, the cladding 502 may be doped with dopants having an opposite doping type than the cores 200. For example, if the cores 200 are n-doped GaN cores, the cladding 502 may be doped with p-type dopants (for example, boron, gallium, $BF_2$, aluminum, or magnesium). The cladding 502 can be made of any material suitable for micro LED claddings, such as, for example, gallium nitride (GaN). In one embodiment, the cladding 502 may be Mg doped GaN. The cladding 502 can be epitaxially grown on the first active layer 500 using PVD, CVD, MOCVD, MBE and/or ALD, and the like. In one embodiment, the cladding 502 can be epitaxially grown to a height ranging from 50 nm to 200 nm or more, for example, 100 nm, although other heights are within the contemplated scope of the disclosure.

Figure 6:
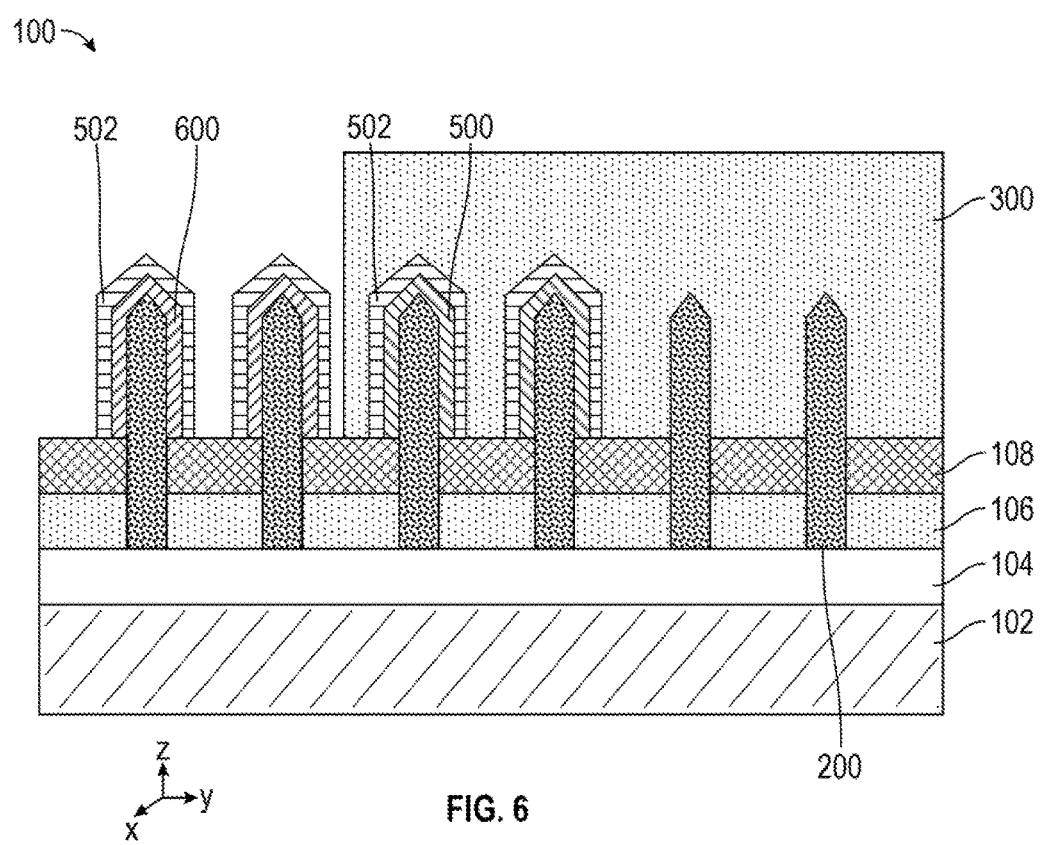
FIG. 6 shows a partial structure of a semiconductor structure during the fabrication of a micro LED device, in accordance with one or more example embodiments of the disclosure.

FIG. 6 depicts a cross-sectional view of the semiconductor structure 100 in accordance with one or more example embodiments of the disclosure. As depicted in FIG. 6, after forming the first active layer 500 over one or more cores of the cores 200, the hard mask 300 can be refilled and re-patterned to expose a second set of one or more cores of the cores 200. In one embodiment, a second active layer 600 may be formed over the second set of one or more cores of the cores 200. The second active layer 600 may be formed in a similar manner as the first active layer 500, except that the atomic concentration of the second active layer 600 may be adjusted to provide a new peak emission wavelength. For example, if the first active layer 500 is tuned to produce blue emission, the second active layer 600 can be tuned to produce red, green, or yellow emission. In one embodiment, the second active layer 600 comprises InGaN having a second indium atomic concentration. In one embodiment, the second indium atomic concentration is about 5 to 10 percent, suitable for blue emission. In one embodiment, the second indium atomic concentration is about 20 to 25 percent, suitable for green emission. In one embodiment, the second indium atomic concentration is about 30 to 40 percent, suitable for red emission. In other embodiments, the second indium atomic concentration may be adjusted between about 5 to about 50 percent, depending on the specific peak emission wavelength desired.

As depicted in FIG. 6, in one embodiment, the cladding 502 may be conformally formed over the second active layer 600. The cladding 502 can be formed over the second active layer 600 in a similar manner as for the first active layer 500. In one embodiment, the cladding 502 may be doped with dopants having an opposite doping type than the cores 200. For example, if the cores 200 are n-doped GaN cores, the cladding 502 is doped with p-type dopants (for example, boron, gallium, $BF_2$, aluminum, or magnesium). The cladding 502 can be made of any material suitable for micro LED claddings, such as, for example, gallium nitride (GaN). In one embodiment, the cladding 502 may be Mg doped GaN. The cladding 502 can be epitaxially grown on the first active layer 500 using PVD, CVD, MOCVD, MBE and/or ALD, and the like. In one embodiment, the cladding 502 can be epitaxially grown to a height ranging from 50 nm to 200 nm or more, for example, 100 nm, although other heights are within the contemplated scope of the disclosure. The cladding 502 formed over the second active layer 600 can have a same or different composition and deposition thickness than the cladding 502 formed over the first active layer 500.

Figure 7:
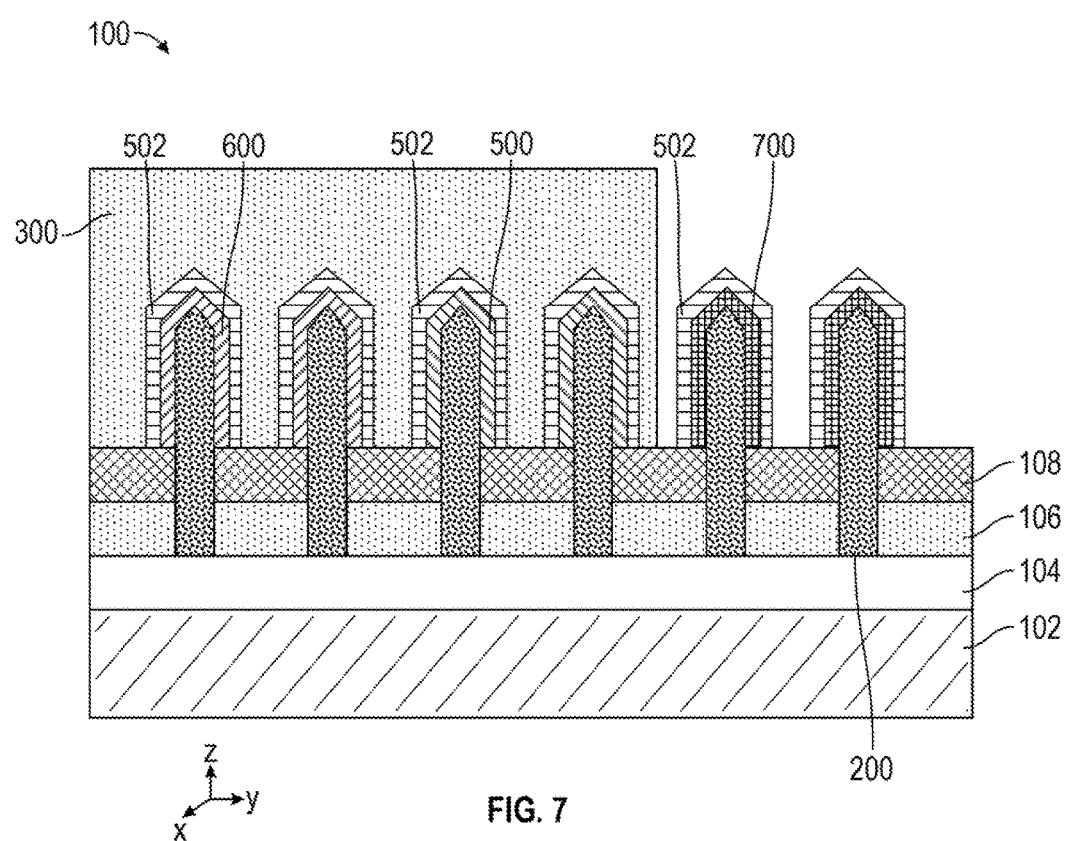
FIG. 7 shows a partial structure of a semiconductor structure during the fabrication of a micro LED device, in accordance with one or more example embodiments of the disclosure.

FIG. 7 depicts a cross-sectional view of the semiconductor structure 100 in accordance with one or more example embodiments of the disclosure. As depicted in FIG. 7, after forming the first active layer 500 and the second active layer 600 over one or more cores of the cores 200, the hard mask 300 can be refilled and re-patterned to expose a third set of one or more cores of the cores 200. In one embodiment, a third active layer 700 may be formed over the third set of one or more cores of the cores 200. The third active layer 700 may be formed in a similar manner as the first active layer 500 and the second active layer 600, except that the atomic concentration of the third active layer 700 may be adjusted to provide a new peak emission wavelength. For example, if the first active layer 500 is tuned to produce blue emission and the second active layer 600 is tuned to produce green emission, the third active layer 700 can be tuned to produce red or yellow emission. In one embodiment, the third active layer 700 comprises InGaN having a third indium atomic concentration. In one embodiment, the third indium atomic concentration is about 5 to 10 percent, suitable for blue emission. In one embodiment, the third indium atomic concentration is about 20 to 25 percent, suitable for green emission. In one embodiment, the third indium atomic concentration is about 30 to 40 percent, suitable for red emission. In other embodiments, the third indium atomic concentration may be adjusted between about 5 to about 50 percent, depending on the specific peak emission wavelength desired.

As depicted in FIG. 7, in one embodiment, the cladding 502 may be conformally formed over the third active layer 700. The cladding 502 can be formed over the third active layer 700 in a similar manner as for the first active layer 500. In one embodiment, the cladding 502 may be doped with dopants having an opposite doping type than the cores 200. For example, if the cores 200 are n-doped GaN cores, the cladding 502 may be doped with p-type dopants (for example, boron, gallium, $BF_2$, aluminum, or magnesium). The cladding 502 can be made of any material suitable for micro LED claddings, such as, for example, gallium nitride (GaN). In one embodiment, the cladding 502 may be Mg doped GaN. The cladding 502 can be epitaxially grown on the first active layer 500 using PVD, CVD, MOCVD, MBE and/or ALD, and the like. In one embodiment, the cladding 502 can be epitaxially grown to a height ranging from 50 nm to 200 nm or more, for example, 100 nm, although other heights are within the contemplated scope of the disclosure. The cladding 502 formed over the third active layer 700 can have a same or different composition and deposition thickness than the cladding 502 formed over the first active layer 500 or the second active layer 600.

Figure 8:
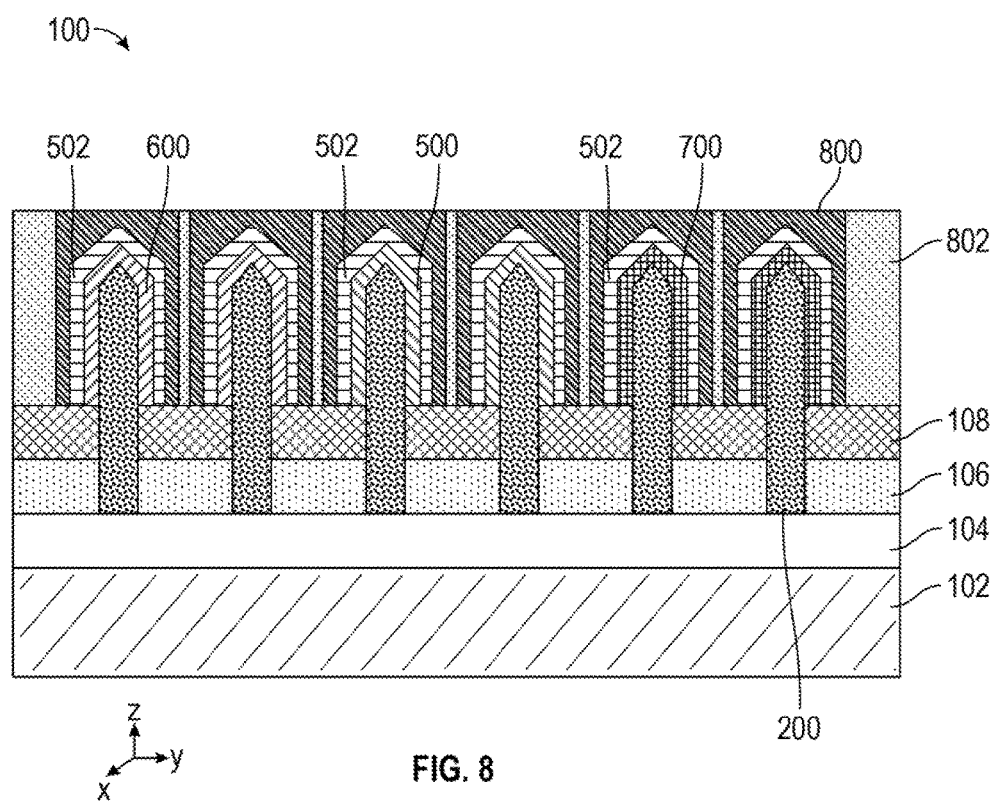
FIG. 8 shows a partial structure of a semiconductor structure during the fabrication of a micro LED device, in accordance with one or more example embodiments of the disclosure.

FIG. 8 depicts a cross-sectional view of the semiconductor structure 100 in accordance with one or more example embodiments of the disclosure. In one embodiment, contacts 800 are formed over each of the cores 200. The contacts 800 can be formed using known metallization techniques. In one embodiment, an ILD 802 may be formed or deposited over the cladding 502. The ILD 802 can be patterned using, for example, a wet etch, a dry etch, or a combination thereof, to provide trenches (not depicted) exposing a surface of one or more of the cladding 502. In one embodiment, these trenches are filled with conductive material to form the contacts 800. In one embodiment, the conductive material may be overfilled into the trenches, forming overburdens above a surface of the ILD 802. The overburden can be removed and the ILD 802 can be planarized using, for example, chemical-mechanical planarization (CMP).

The contacts 800 can be made of any suitable conducting material, such as, for example, metal (for example, tungsten, titanium, tantalum, ruthenium, zirconium, cobalt, copper, aluminum, lead, platinum, tin, silver, gold), conducting metallic compound material (for example, tantalum nitride, titanium nitride, tantalum carbide, titanium carbide, titanium aluminum carbide, tungsten silicide, tungsten nitride, ruthenium oxide, cobalt silicide, nickel silicide), carbon nanotubes, conductive carbon, graphene, or any suitable combination of these materials. The conductive material can further include dopants that are incorporated during or after deposition. In one embodiment, the contacts can be copper or tungsten and can include a barrier metal liner (not depicted). A barrier metal liner prevents copper or tungsten from diffusing into, or doping, the surrounding materials, which can degrade their properties. Some semiconductor materials, such as silicon, form deep-level traps when doped with copper. An ideal barrier metal liner must limit the bulk metal diffusivity sufficiently to chemically isolate the conductor from the surrounding materials and should have a high electrical conductivity, for example, tantalum, tantalum nitride, titanium, titanium nitride, cobalt, ruthenium, manganese, or titanium carbide. In one embodiment, the contacts 800 include a metal (for example, titanium) that reacts with semiconductor materials (for example, the cladding 502) to form a silicide film (not depicted) between the cladding 502 and the contacts 800. As the silicide film is only formed at the interface between the contacts 800 and the cladding 502, the silicide film can be said to be self-aligned to the surface of the cladding 502 (a self-aligned silicide is also referred to as a salicide).

Figure 9:
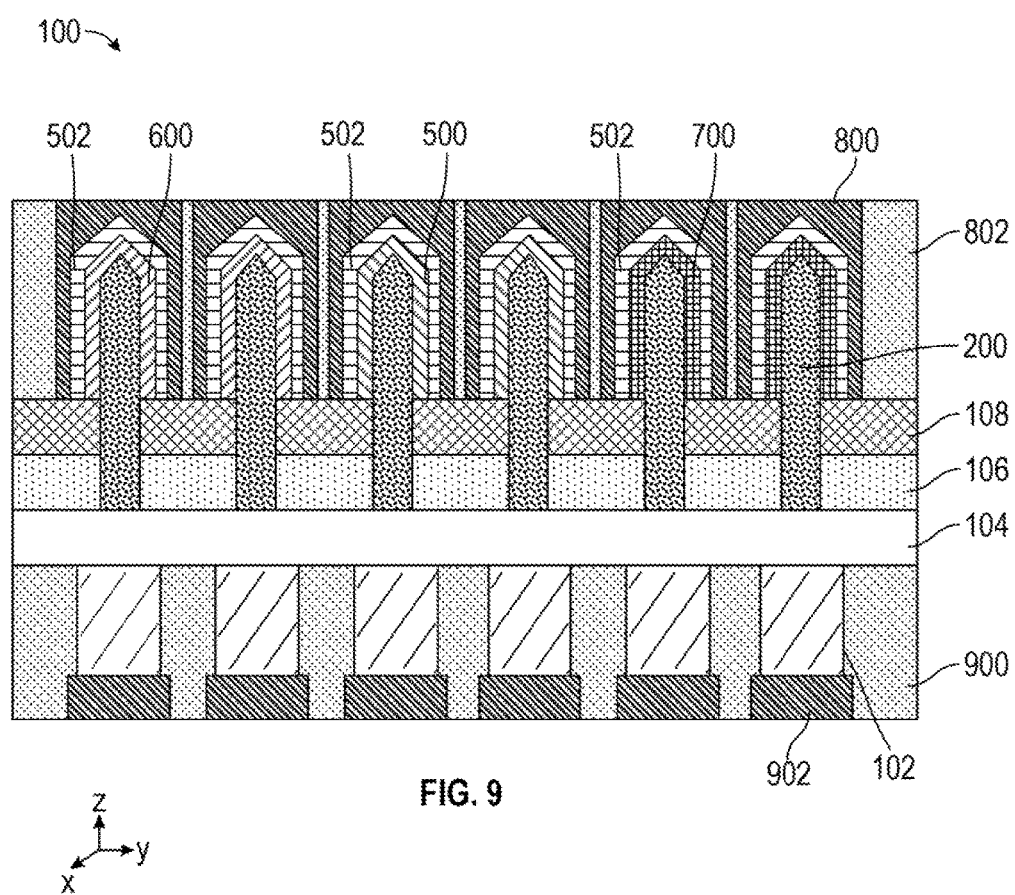
FIG. 9 shows a partial structure of a semiconductor structure during the fabrication of a micro LED device, in accordance with one or more example embodiments of the disclosure.

FIG. 9 depicts a cross-sectional view of the semiconductor structure 100 after backside processing in accordance with one or more example embodiments of the disclosure. In one embodiment, the substrate 102 may be patterned into two or more regions. The substrate 102 can be patterned using, for example, a wet etch, a dry etch, or a combination thereof. In one embodiment, the substrate 102 may be patterned using a reactive ion etch (RIE) selective to the semiconductor layer 104. In one embodiment, the substrate 102 may be thinned prior to, or after patterning, for example, to a thickness 10%, 20%, 40%, 60%, 80%, or 90% of the original thickness.

In one embodiment, the two or more patterned regions of the substrate 102 can be electrically isolated using an isolation structure 900. In one embodiment, the isolation structure 900 can include an oxide layer (for example, silicon dioxide), or any other electrically insulating layer. In one embodiment, the isolation structure 900 may include polyimide, epoxy, photodefinable materials (for example, benzocyclobutene), WPR-series materials, and/or spin-on-glass. In one embodiment, the isolation structure 900 can include a low permittivity (low-k) ILD layer. In one embodiment, the isolation structure 900 can be deposited using PVD, CVD, MOCVD, MBE, and the like.

In one embodiment, contacts 902 (also referred to as metal pads) are formed over each of the two or more patterned regions of the substrate 102. The contacts 902 can be formed using known metallization techniques, in a similar matter as the contacts 800. In one embodiment, the isolation structure 900 may be patterned using, for example, a wet etch, a dry etch, or a combination thereof, to provide trenches (not depicted) that are filled with conductive material to form the contacts 902. In one embodiment, the conductive material may be overfilled into the trenches, forming overburdens above a surface of the isolation structure 900. The overburden can be removed and the isolation structure 900 can be planarized using, for example, CMP. In one embodiment, the contacts 902 are bonded to a TFT backplane and CMOS circuitry (not depicted). Backplane switching allows for each component, or electrically coupled group of components, to be switched on or off, by controlling current through the contacts 902.

Figure 10:
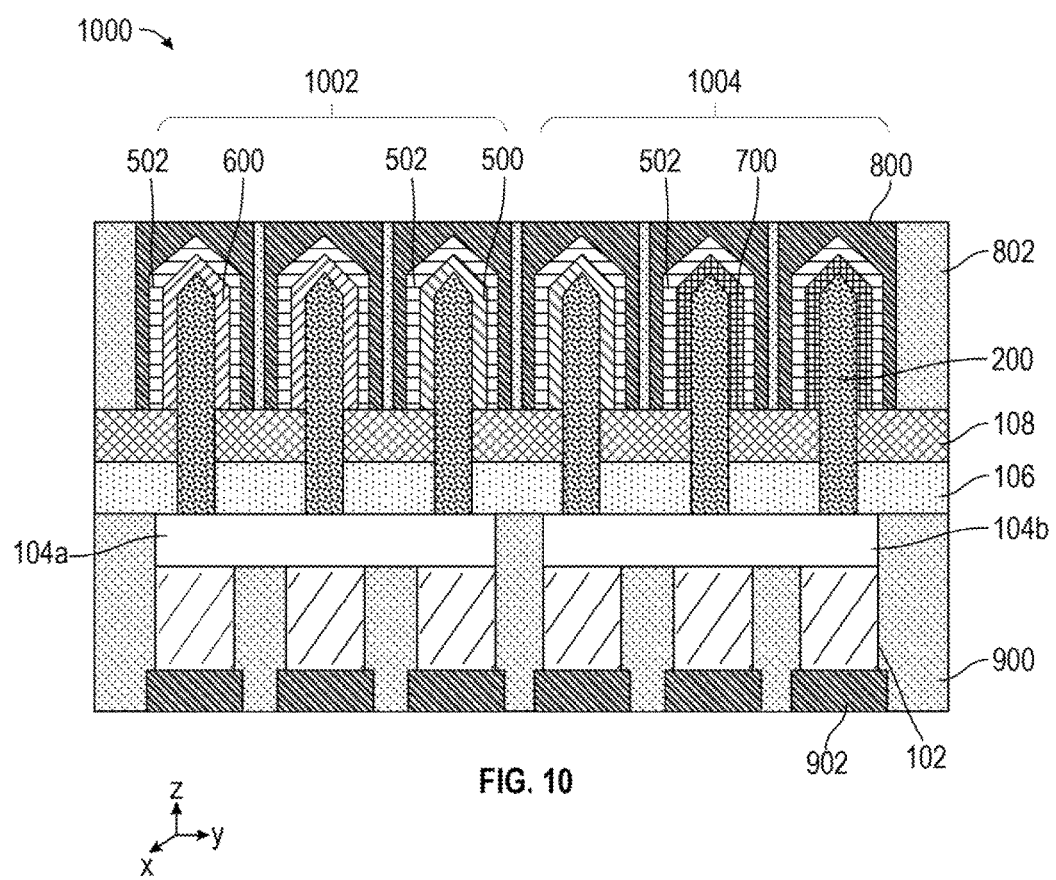
FIG. 10 shows a partial structure of a semiconductor structure during the fabrication of a micro LED device, in accordance with one or more example embodiments of the disclosure.

FIG. 10 depicts a cross-sectional view of a semiconductor structure 1000 after backside processing in accordance with one or more example embodiments of the disclosure. As depicted in FIG. 10, in one embodiment, the semiconductor layer 104 may be patterned into two or more regions 104*a* and 104*b*. In one embodiment, region 104*a* of the semiconductor layer 104 may be formed under a first pixel bank 1002, while region 104*b* of the semiconductor layer 104 may be formed under a second pixel bank 1004. In this manner, individual pixel banks (for example, pixel banks 1002 and 1004), each including two or more components, can be electrically isolated from each other. Accordingly, each of the pixel banks 1002 and 1004 can be individually switched on or off. In one embodiment, the semiconductor layer 104 may be instead patterned into two or more regions such that each of the cores 200 may be provided with an individual, electrically isolated region of the semiconductor layer 104 (not depicted). In this manner, each of the components of the semiconductor structure 100 can be individually switched on or off.

Figure 11:
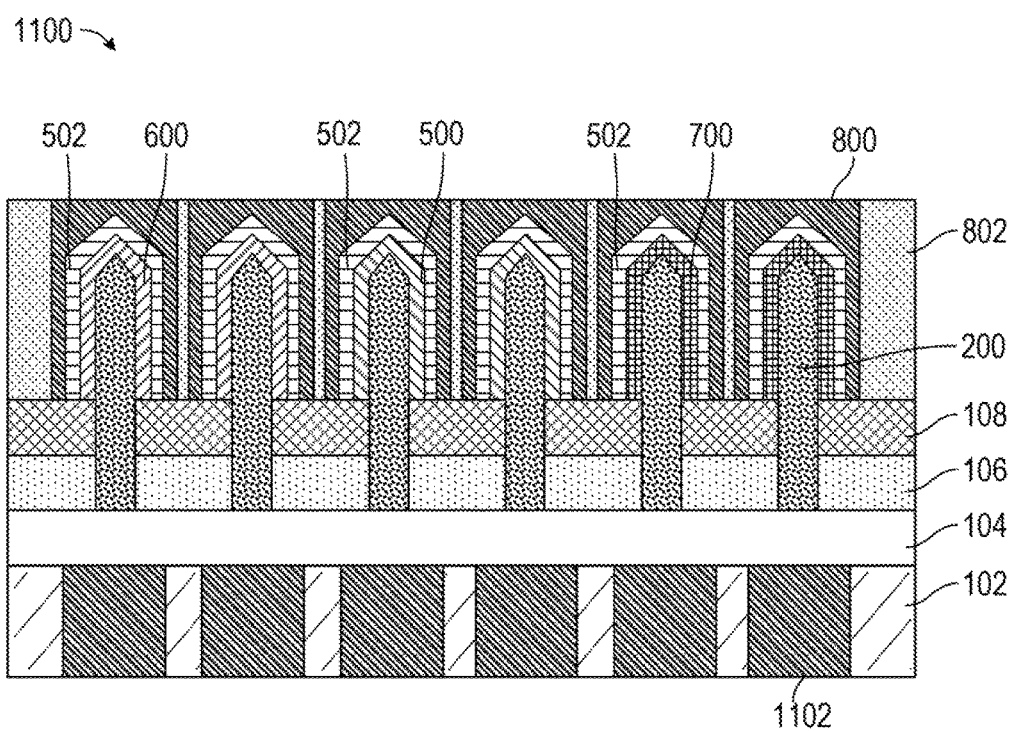
FIG. 11 shows a partial structure of a semiconductor structure during the fabrication of a micro LED device, in accordance with one or more example embodiments of the disclosure.

FIG. 11 depicts a cross-sectional view of a semiconductor structure 1100 after backside processing in accordance with one or more example embodiments of the disclosure. The backside processing depicted in FIG. 11 allows for a simplified workflow, and can be used, for example, in embodiments where the substrate 102 is not doped. As depicted in FIG. 11, in one embodiment, one or more contacts 1102 are formed on a surface of the semiconductor layer 104. The semiconductor layer 104 can be a common layer (as shown in FIG. 9) or a patterned layer (as shown in FIG. 10), depending on the type of component or pixel bank switching control desired. The one or more contacts 1102 can be formed similarly to the contacts 902, as discussed previously herein. For example, the substrate 102 can be patterned with one or more trenches (not depicted) which can be filled with conductive material. The conductive material can be planarized using, for example, CMP.

Figure 12:
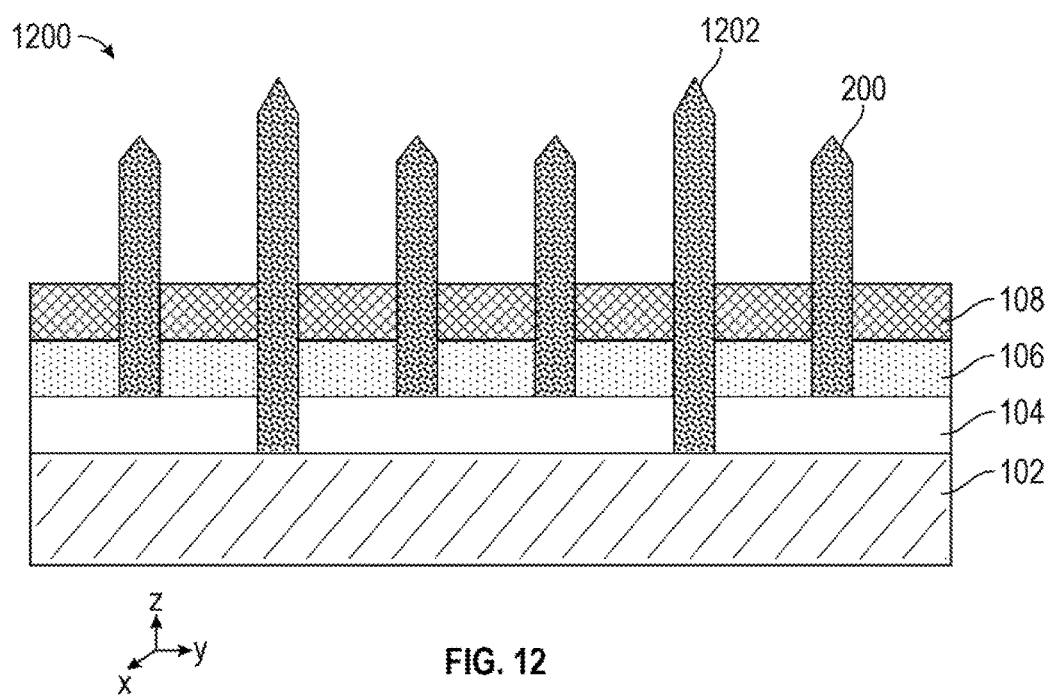
FIG. 12 shows a partial structure of a semiconductor structure during the fabrication of a micro LED device, in accordance with one or more example embodiments of the disclosure.

FIG. 12 depicts a cross-sectional view of a semiconductor structure 1200 in accordance with one or more example embodiments of the disclosure. The semiconductor structure 1200 can be formed in a similar manner as the semiconductor structure 100 depicted in FIG. 2, except that the semiconductor structure 1200 includes one or more cores 1202 having a tall aspect ratio (with respect, for example, to the other cores 200). Forming some of the components using tall aspect ratio cores can reduce defects and boost luminescence, for example, in components designed for red emission. In one embodiment, some of the components (for example, the red components) are formed using alternative processes and materials, while the other components (for example, the blue, yellow, or green components) are formed according to one or more embodiments of the disclosure. For example, in one embodiment, the red components include cores 1202 comprising GaAs, active layers comprising AlGaInP, and cladding comprising AlGaP. In one embodiment, the aspect ratio of the cores 1202 can be increased by extending the cores 1202 through the semiconductor layer 104 to a surface of the substrate 102. In one embodiment, the aspect ratio of the cores 1202 can be increased by increasing the formed or epitaxially grown height of the cores 1202. The cores 1202 can be epitaxially grown, for example, to a height 10%, 20%, 40%, 75%, 90%, 100%, or 150% greater than a height of the cores 200, although other heights are within the contemplated scope of the disclosure.

Figure 13:
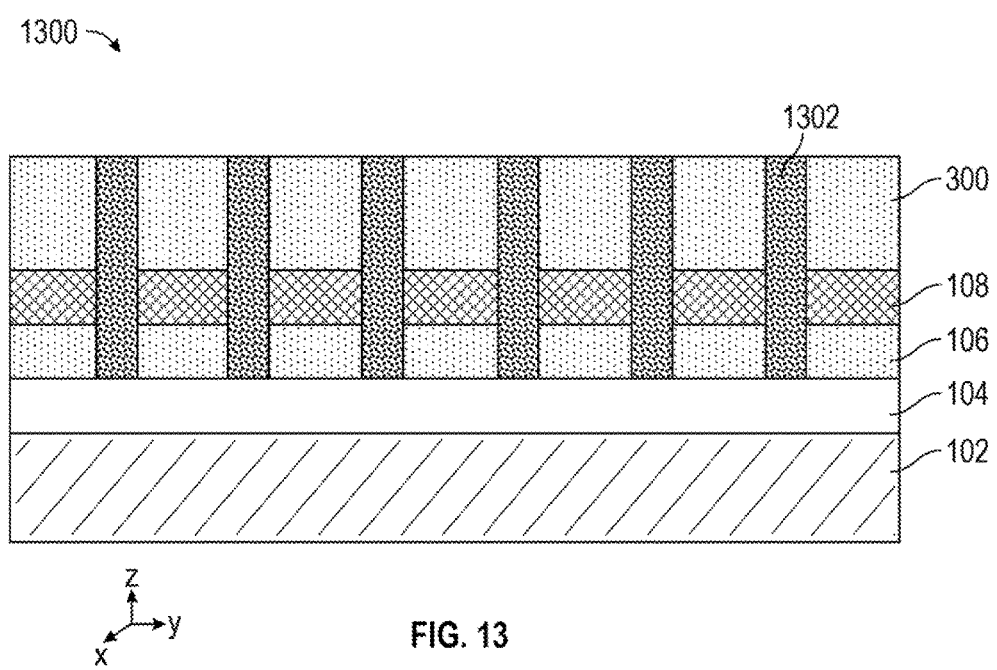
FIG. 13 shows a partial structure of a semiconductor structure during the fabrication of a micro LED device, in accordance with one or more example embodiments of the disclosure.
Figure 14:
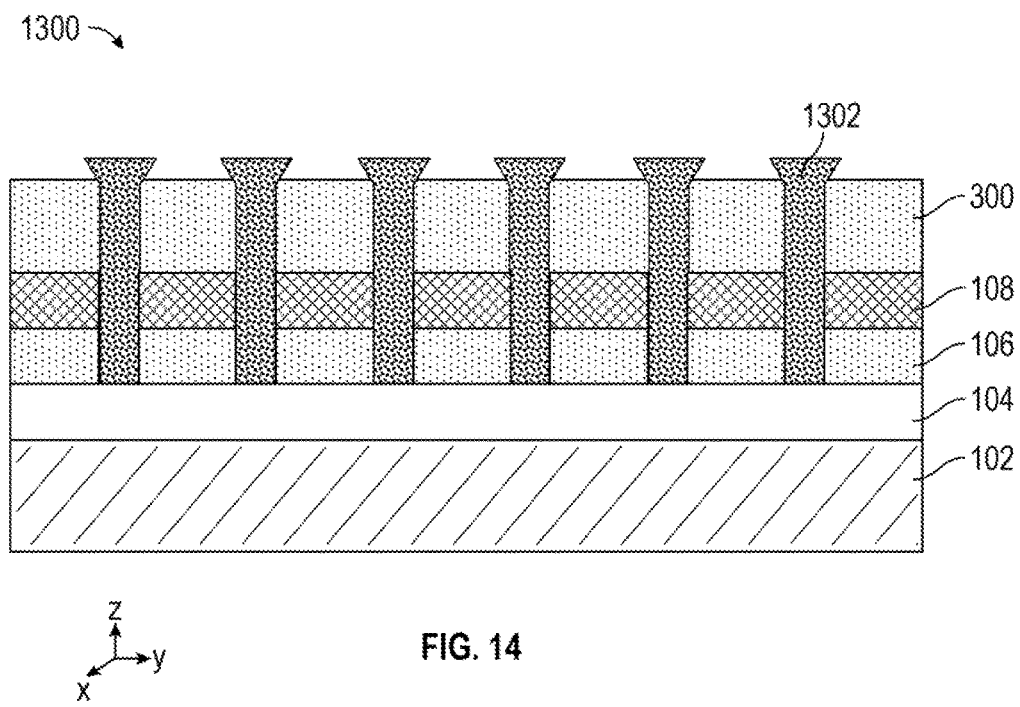
FIG. 14 shows a partial structure of a semiconductor structure during the fabrication of a micro LED device, in accordance with one or more example embodiments of the disclosure.
Figure 15:
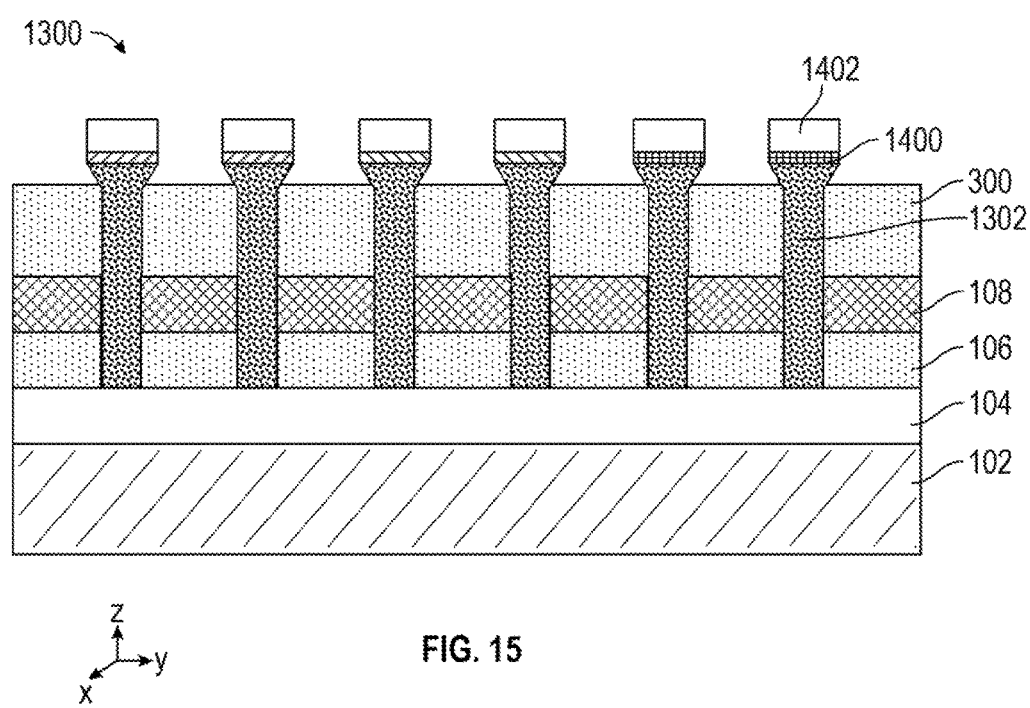
FIG. 15 shows a partial structure of a semiconductor structure during the fabrication of a micro LED device, in accordance with one or more example embodiments of the disclosure.

FIGS. 13-15 depict one or more components having a different core and component structure than that shown in FIGS. 1-12. Different component structures can inherently differ in terms of light extraction. Accordingly, component structures can be adapted for a given application. FIG. 13 depicts a cross-sectional view of a semiconductor structure 1300 in accordance with one or more example embodiments of the disclosure. The semiconductor structure 1300 can be formed in a similar manner as the semiconductor structure 100 depicted in FIG. 3, except that the hard mask 300 may be planarized to form a first portion of one or more cores 1302. The hard mask 300 and cores 1302 can be planarized using, for example, CMP.

FIG. 14 depicts a cross-sectional view of the semiconductor structure 1300 in accordance with one or more example embodiments of the disclosure. As depicted in FIG. 14, a second portion of the cores 1302 can be formed above a surface of the hard mask 300. In one embodiment, the second portion of the cores 1302 can be epitaxially grown on the exposed first portion of the cores 1302 using PVD, CVD, MOCVD, MBE and/or ALD, and the like.

FIG. 15 depicts a cross-sectional view of the semiconductor structure 1300 in accordance with one or more example embodiments of the disclosure. As depicted in FIG. 15, an active layer 1400 and a cladding 1402 can be formed over the cores 1302. In one embodiment, the active layer 1400 may be selectively formed on a surface of the cores 1302. In one embodiment, the active layer 1400 comprises InGaN having a fourth indium atomic concentration. In one embodiment, the fourth indium atomic concentration is about 5 to 10 percent, suitable for blue emission. In one embodiment, the fourth indium atomic concentration is about 20 to 25 percent, suitable for green emission. In one embodiment, the fourth indium atomic concentration is about 30 to 40 percent, suitable for red emission. In other embodiments, the fourth indium atomic concentration may be adjusted between about 5 to about 50 percent, depending on the specific peak emission wavelength desired. The active layer 1400 can be epitaxially grown on one or more cores of the cores 1302 using PVD, CVD, MOCVD, MBE and/or ALD, and the like. In one embodiment, the active layer 1400 can be epitaxially grown to a height ranging from 10 nm to 200 nm or more, for example, 100 nm, although other heights are within the contemplated scope of the disclosure.

In one embodiment, the cladding 1402 may be conformally formed over the active layer 1400. In one embodiment, the cladding 1402 may be doped with dopants having an opposite doping type than the cores 1302. For example, if the cores 1302 are n-doped GaN cores, the cladding 1402 is doped with p-type dopants (for example, boron, gallium, $BF_2$, aluminum, or magnesium). The cladding 1402 can be made of any material suitable for micro LED claddings, such as, for example, gallium nitride (GaN). In one embodiment, the cladding 1402 may be Mg doped GaN. The cladding 1402 can be epitaxially grown on the active layer 1400 using PVD, CVD, MOCVD, MBE and/or ALD, and the like. In one embodiment, the cladding 1402 can be epitaxially grown to a height ranging from 50 nm to 200 nm or more, for example, 100 nm, although other heights are within the contemplated scope of the disclosure.

Figure 16:
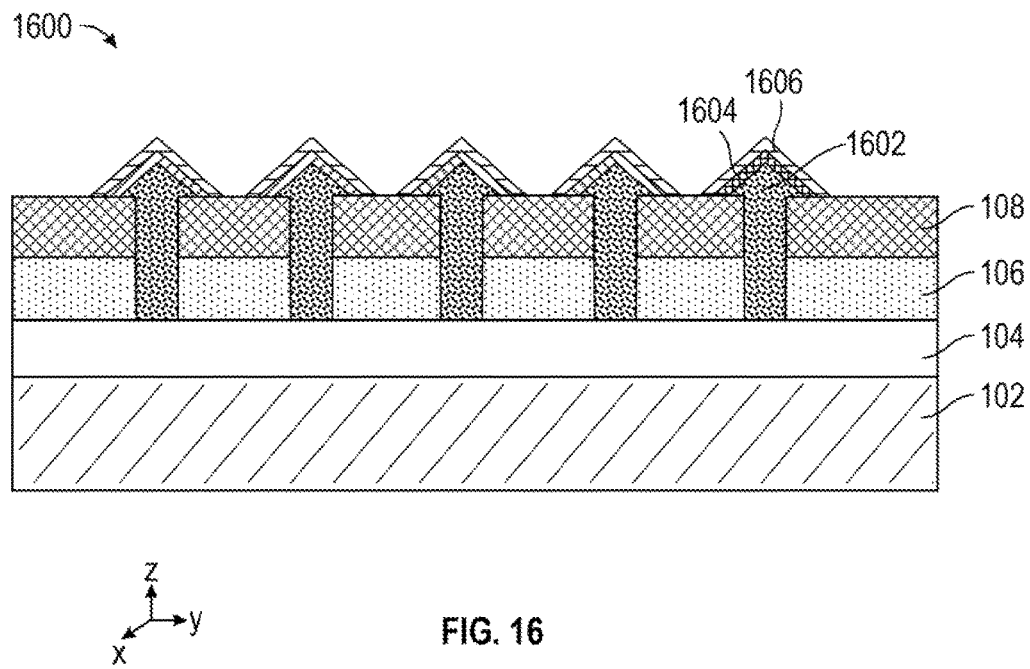
FIG. 16 shows a partial structure of a semiconductor structure during the fabrication of a micro LED device, in accordance with one or more example embodiments of the disclosure.

FIG. 16 depicts a cross-sectional view of a semiconductor structure 1600 having a different core and component structure than that shown in FIGS. 1-12 and FIGS. 13-15. As discussed previously herein, different component structures can inherently differ in terms of light extraction. As depicted in FIG. 16, the substrate 102, semiconductor layer 104, reflective coating 106, and isolation structure 108 can be formed in a similar manner as the semiconductor structure 100 depicted in FIG. 3. The one or more cores 1602, however, may be formed using a different process than that used to form the cores 200. In one embodiment, the cores 1602 are formed using a high temperature, low pressure MOCVD process. In this manner, cores 1602 having a pyramidal shape can be formed. In one embodiment, the temperature can be more than about 500 degrees Celsius, for example, about 900 to 1300 degrees Celsius. In one embodiment, the pressure can range from 0.1 to about 100 Torr, for example, 15 Torr. An active layer 1604 and a cladding 1606 can be formed over the cores 1602, according to one or more embodiments.

Figure 17:
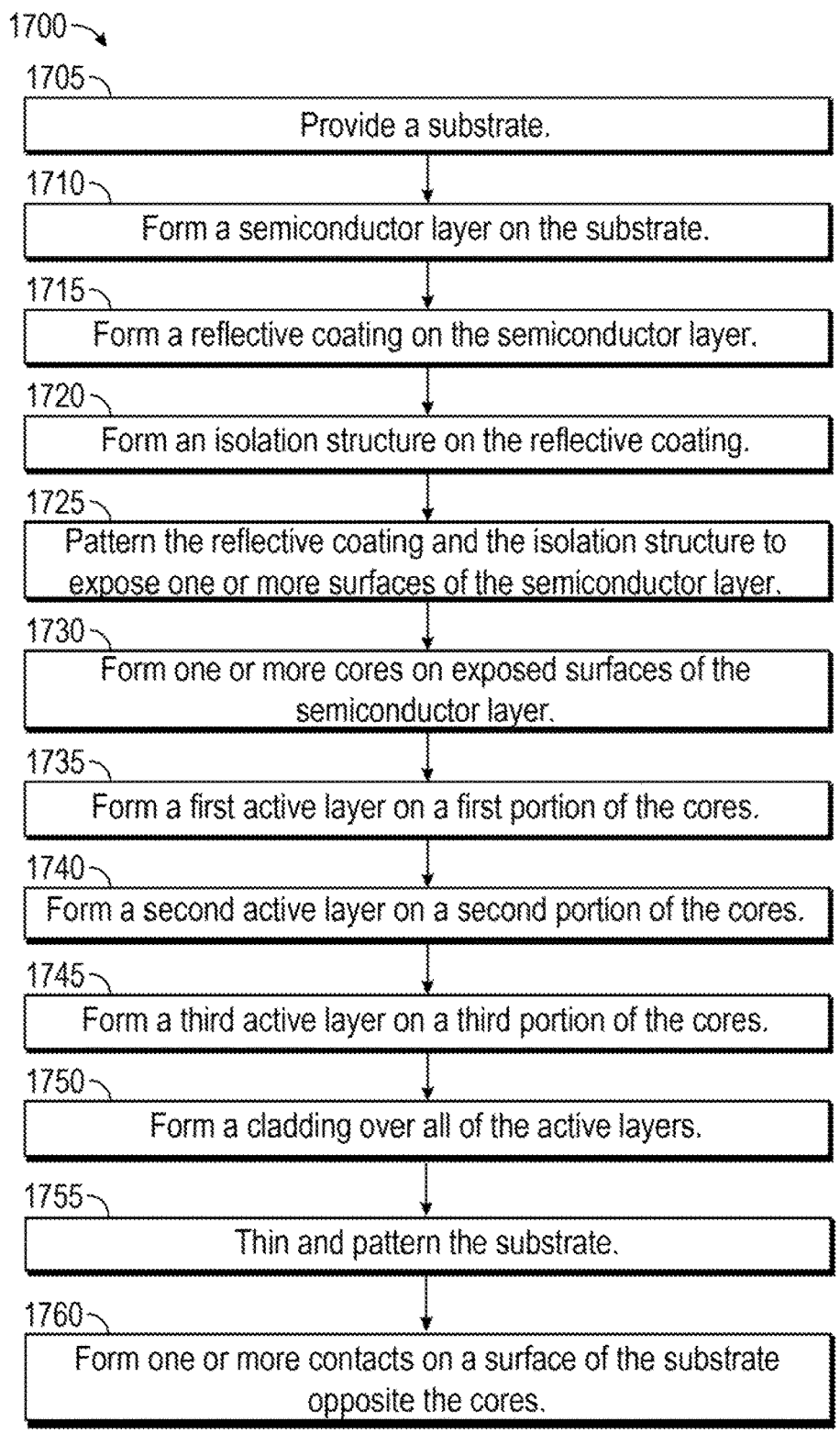
FIG. 17 shows a diagram of an example process flow for the fabrication of a semiconductor structure in accordance with example embodiments of the disclosure.

FIG. 17 shows a diagram of an example flow diagram for the fabrication of a micro LED structure, in accordance with example embodiments of the disclosure. In block 1705, a substrate can be provided. In one embodiment, the substrate can include a semiconductor material having a Miller indices of {111}. In one embodiment, the substrate can include gallium oxide. In one embodiment, the substrate can include n-doped gallium oxide.

In block 1710, a semiconductor layer may be formed on the substrate. The semiconductor layer can be formed in a similar manner as the semiconductor layer 104 discussed previously herein. In one embodiment the semiconductor layer includes gallium nitride (GaN). In one embodiment, the semiconductor layer may be epitaxially grown on the substrate using a planar epitaxy process. In one embodiment, planar epitaxy results in the semiconductor layer having a hexagonal crystalline structure (for example, a structure having Miller indices of {111}).

In block 1715, a reflective coating may be formed on the semiconductor layer. The reflective coating can be formed in a similar manner as the reflective coating 106 discussed previously herein. In one embodiment, the reflective coating comprises silver.

In block 1720, an isolation structure may be formed on the reflective coating. The isolation structure can be formed in a similar manner as the isolation structure 108 discussed previously herein.

In block 1725, the reflective coating and the isolation structure are patterned to expose one or more surfaces of the semiconductor layer.

In block 1730, one or more cores are formed on the exposed surfaces of the semiconductor layer. The cores can be formed in a similar manner as the cores 200, cores 1202, cores 1302, or cores 1602 discussed previously herein. In one embodiment, the cores include n-doped gallium nitride.

In block 1735, a first active layer may be formed on a first portion of the cores. The first active layer can be formed in a similar manner as the first active layer 500 discussed previously herein. In one embodiment, the first active layer includes a first atomic concentration of indium.

In block 1740, a second active layer may be formed on a second portion of the cores. The second active layer can be formed in a similar manner as the second active layer 600 discussed previously herein. In one embodiment, the second active layer includes a second atomic concentration of indium.

In block 1745, a third active layer may be formed on a third portion of the cores. The third active layer can be formed in a similar manner as the third active layer 700 discussed previously herein. In one embodiment, the third active layer includes a third atomic concentration of indium.

In block 1750, a cladding may be formed over all of the active layers. The cladding can be formed in a similar manner as the cladding 502 discussed previously herein. The cladding may be doped with dopants having an opposite doping type than that used to dope the cores and the semiconductor layer.

In block 1755, the substrate may be thinned and patterned. The substrate can be thinned and patterned in a similar manner as the substrate 102, as depicted in any of FIGS. 9-11.

In block 1760, one or more contacts are formed on a surface of the substrate opposite the cores. The contacts can be formed in a similar manner as the contacts 902 or the contacts 1102, as discussed previously herein.

Figure 18:
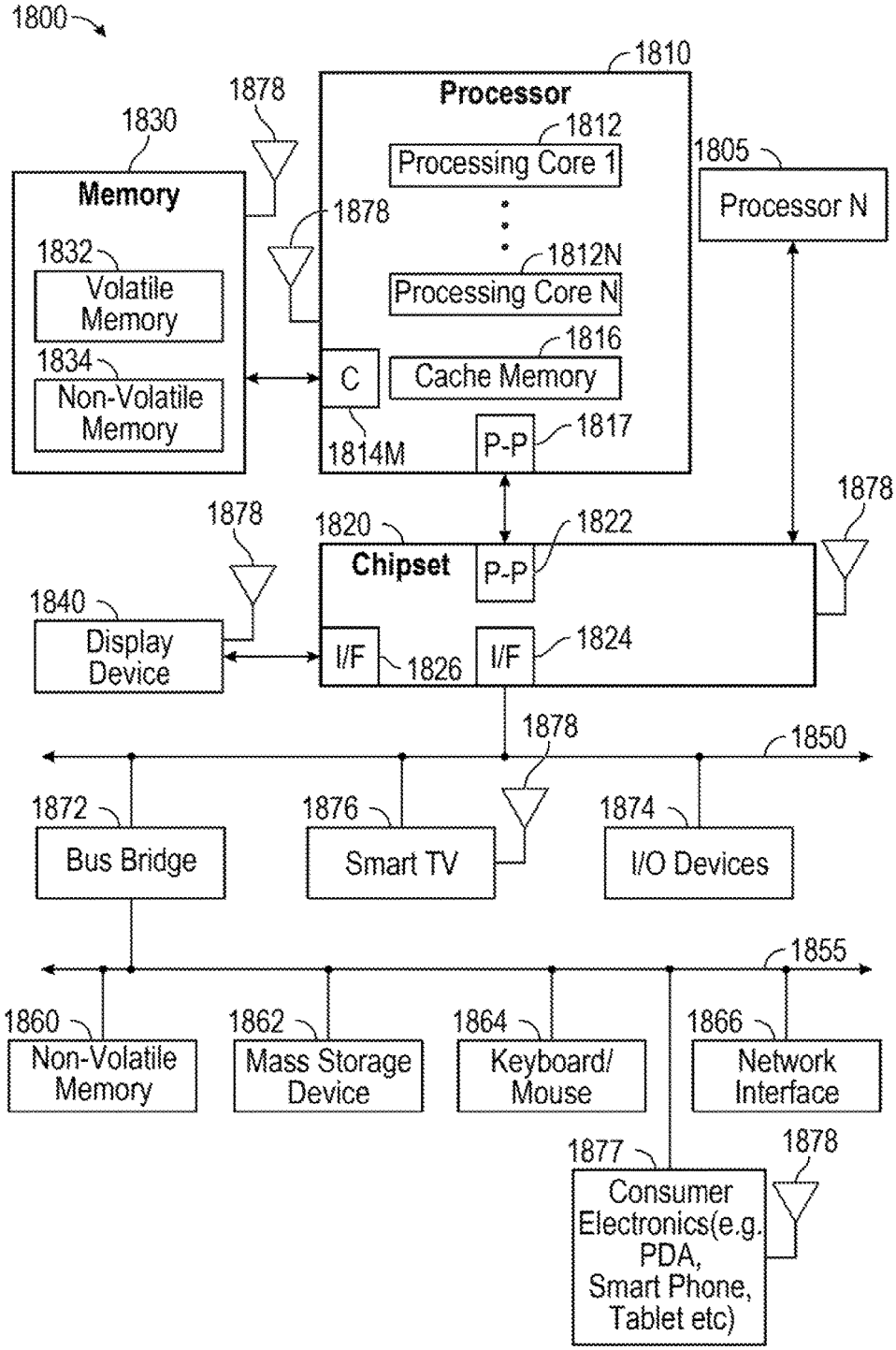
FIG. 18 depicts an example of a system, in accordance with one or more embodiments of the disclosure.

FIG. 18 depicts an example of a system 1800 according to one or more embodiments of the disclosure. In one embodiment, the LED and micro LED structures described herein can be used in connection with or formed as a part of any of the devices shown in system 1800. In one embodiment, system 1800 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1800 can include a system on a chip (SOC) system.

In one embodiment, system 1800 includes multiple processors including processor 1810 and processor N 1805, where processor N 1805 has logic similar or identical to the logic of processor 1810. In one embodiment, processor 1810 has one or more processing cores (represented here by processing core 1 1812 and processing core N 1812N, where 1812N represents the Nth processor core inside processor 1810, where N is a positive integer). More processing cores can be present (but not depicted in the diagram of FIG. 18). In some embodiments, processing core 1812 includes, but is not limited to, pre-fetch logic to fetch instructions, decode logic to decode the instructions, execution logic to execute instructions, a combination thereof, or the like. In some embodiments, processor 1810 has a cache memory 1816 to cache instructions and/or data for system 1800. Cache memory 1816 may be organized into a hierarchical structure including one or more levels of cache memory.

In some embodiments, processor 1810 includes a memory controller (MC) 1814, which is configured to perform functions that enable the processor 1810 to access and communicate with memory 1830 that includes a volatile memory 1832 and/or a non-volatile memory 1834. In some embodiments, processor 1810 can be coupled with memory 1830 and chipset 1820. Processor 1810 may also be coupled to a wireless antenna 1878 to communicate with any device configured to transmit and/or receive wireless signals. In one embodiment, the wireless antenna 1878 operates in accordance with, but is not limited to, the IEEE 1102.11 standard and its related family, Home Plug AV (HPAV), Ultra Wide Band (UWB), Bluetooth, WiMax, or any form of wireless communication protocol.

In some embodiments, volatile memory 1832 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1834 includes, but is not limited to, flash memory, phase change memory (PCM), read-only memory (ROM), electrically erasable programmable read-only memory (EEPROM), or any other type of non-volatile memory device.

Memory device 1830 stores information and instructions to be executed by processor 1810. In one embodiment, memory 1830 may also store temporary variables or other intermediate information while processor 1810 is executing instructions. In the illustrated embodiment, chipset 1820 connects with processor 1810 via Point-to-Point (PtP or P-P) interface 1817 and P-P interface 1822. Chipset 1820 enables processor 1810 to connect to other elements in system 1800. In some embodiments of the disclosure, P-P interface 1817 and P-P interface 1822 can operate in accordance with a PtP communication protocol, such as the Intel® QuickPath Interconnect (QPI) or the like. In other embodiments, a different interconnect may be used.

In some embodiments, chipset 1820 can be configured to communicate with processor 1810, the processor N 1805, display device 1840, and other devices 1872, 1876, 1874, 1860, 1862, 1864, 1866, 1877, etc. Chipset 1820 may also be coupled to the wireless antenna 1878 to communicate with any device configured to transmit and/or receive wireless signals.

Chipset 1820 connects to display device 1840 via interface 1826. Display 1840 may be, for example, a liquid crystal display (LCD), a plasma display, cathode ray tube (CRT) display, or any other form of visual display device. In some embodiments of the disclosure, processor 1810 and chipset 1820 are integrated into a single SOC. In addition, chipset 1820 connects to bus 1850 and/or bus 1855 that interconnect various elements 1874, 1860, 1862, 1864, and 1866.

Bus 1850 and bus 1855 may be interconnected via a bus bridge 1872. In one embodiment, chipset 1820 couples with a non-volatile memory 1860, a mass storage device(s) 1862, a keyboard/mouse 1864, and a network interface 1866 via interface 1824 and/or 1826, smart TV 1876, consumer electronics 1877, etc.

In one embodiment, mass storage device(s) 1862 can include, but not be limited to, a solid state drive, a hard disk drive, a universal serial bus flash memory drive, or any other form of computer data storage medium. In one embodiment, network interface 1866 is implemented by any type of well-known network interface standard including, but not limited to, an Ethernet interface, a universal serial bus (USB) interface, a Peripheral Component Interconnect (PCI)

Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 18 are depicted as separate blocks within the system 1800, the functions performed by some of these blocks may be integrated within a single semiconductor circuit or may be implemented using two or more separate integrated circuits. For example, although cache memory 1816 is depicted as a separate block within processor 1810, cache memory 1816 or selected elements thereof can be incorporated into processing core 1812.

It is noted that the system 1800 described herein may include any suitable type of microelectronics packaging and configurations thereof, including, for example, system in a package (SiP), system on a package (SOP), package on package (PoP), interposer package, 3D stacked package, etc. Further, any suitable type of microelectronic components may be provided in the semiconductor packages, as described herein. For example, microcontrollers, microprocessors, baseband processors, digital signal processors, memory dies, field gate arrays, logic gate dies, passive component dies, MEMSs, surface mount devices, application specific integrated circuits, baseband processors, amplifiers, filters, combinations thereof, or the like may be packaged in the semiconductor packages, as disclosed herein. The semiconductor devices (for example, the semiconductor devices described in connection with any of FIGS. 1-14), as disclosed herein, may be provided in any variety of electronic devices including consumer, industrial, military, communications, infrastructural, and/or other electronic devices.

In various embodiments, the devices, as described herein, may be used in connection with one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system and the one or more processors and any chipset included in an electronic device may be from a family of Intel® processors and chipsets, such as the Intel® Atom® processor(s) family or Intel-64 processors (for example, Sandy Bridge®, Ivy Bridge®, Haswell®, Broadwell®, Skylake®, etc.).

Additionally or alternatively, the devices, as described herein, may be used in connection with one or more additional memory chips. The memory may include one or more volatile and/or non-volatile memory devices including, but not limited to, magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read-only memory (EEPROM), non-volatile RAM (NVRAM), universal serial bus (USB) removable memory, or combinations thereof.

In example embodiments, the electronic device in which the disclosed devices are used and/or provided may be a computing device. Such a computing device may house one or more boards on which the devices may be disposed. The board may include a number of components including, but not limited to, a processor and/or at least one communication chip. The processor may be physically and electrically connected to the board through, for example, electrical connections of the devices. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

Example 1 may include an integrated circuit (IC) structure comprising: a substrate comprising a metal and oxygen; a core over the substrate, the core comprising a group III semiconductor material, the core doped with n-type or p-type dopants; an active layer on a surface of the core, the active layer comprising indium; and a cladding on a surface of the active layer, the cladding doped with n-type or p-type dopants.

Example 2 may include the structure of example 1 and/or some other example herein, further comprising a semiconductor layer between the substrate and the core.

Example 3 may include the structure of example 2 and/or some other example herein, further comprising a reflective coating on the semiconductor layer.

Example 4 may include the structure of example 1 and/or some other example herein, wherein the substrate comprises gallium.

Example 5 may include the structure of example 1 and/or some other example herein, wherein the substrate comprises Miller indices of {111}.

Example 6 may include the structure of example 1 and/or some other example herein, wherein the cladding comprises magnesium doped gallium and nitrogen.

Example 7 may include the structure of example 1 and/or some other example herein, wherein the core comprises gallium and nitrogen.

Example 8 may include the structure of example 1 and/or some other example herein, wherein the active layer comprises an atomic concentration of 5 to 10 percent indium, an atomic concentration of 20 to 25 percent indium, or an atomic concentration of 30 to 40 percent indium.

Example 9 may include the structure of example 1 and/or some other example herein, wherein the core and the cladding are doped with opposite type dopants.

Example 10 may include the structure of example 1 and/or some other example herein, wherein the core comprises a nanopillar.

Example 11 may include an integrated circuit (IC) structure comprising: a substrate comprising a metal and oxygen; a first core, a second core, and a third core over the substrate, the cores comprising a group III semiconductor material, the cores doped with n-type dopants; a first active layer on a surface of the first core, the first active layer comprising a first atomic concentration of indium; a second active layer on a surface of the second core, the second active layer comprising a second atomic concentration of indium; a third active layer on a surface of the third core, the third active layer comprising a third atomic concentration of indium; and a cladding on the first, second, and third active layers, the cladding doped with p-type dopants.

Example 12 may include the structure of example 11 and/or some other example herein, further comprising an isolation structure electrically isolating the individual cores.

Example 13 may include the structure of example 11 and/or some other example herein, wherein the substrate comprises gallium.

Example 14 may include the structure of example 11 and/or some other example herein, wherein the first atomic concentration of indium comprises an atomic concentration of 5 to 10 percent indium, the second atomic concentration of indium comprises an atomic concentration of 20 to 25 percent indium, and the third atomic concentration of indium comprises an atomic concentration of 30 to 40 percent indium.

Example 15 may include the structure of example 11 and/or some other example herein, wherein the first, second, and third cores comprise gallium and nitrogen.

Example 16 may include the structure of example 11 and/or some other example herein, further comprising a fourth core over the substrate.

Example 17 may include the structure of example 16 and/or some other example herein, further comprising a fourth active layer on a surface of the fourth core, the fourth active layer comprising a fourth atomic concentration of indium.

Example 18 may include a method for fabricating an integrated circuit (IC) structure, the method comprising: forming a substrate comprising a metal and oxygen; forming a core over the substrate, the core comprising a group III semiconductor material and nitrogen, the core doped with n-type dopants; forming an active layer on a surface of the core, the active layer comprising indium; and forming a cladding on the active layer, the cladding doped with p-type dopants.

Example 19 may include the method of example 18 and/or some other example herein, wherein the substrate comprises gallium.

Example 20 may include the method of example 18 and/or some other example herein, further comprising forming a semiconductor layer between the substrate and the core.

Example 21 may include a device comprising an integrated circuit (IC) structure comprising: a substrate comprising a metal and oxygen; a core over the substrate, the core comprising a group III semiconductor material, the core doped with n-type or p-type dopants; an active layer on a surface of the core, the active layer comprising indium; and a cladding on a surface of the active layer, the cladding doped with n-type or p-type dopants.

Example 22 may include the device of example 21 and/or some other example herein, further comprising a semiconductor layer between the substrate and the core.

Example 23 may include the device of example 22 and/or some other example herein, further comprising a reflective coating on the semiconductor layer.

Example 24 may include the device of example 21 and/or some other example herein, wherein the substrate comprises gallium.

The Example 25 may include the device of example 21 and/or some other example herein, wherein the substrate comprises Miller indices of {111}.

Example 26 may include the device of example 21 and/or some other example herein, wherein the cladding comprises magnesium doped gallium and nitrogen.

Example 27 may include the device of example 21 and/or some other example herein, wherein the core comprises gallium and nitrogen.

Example 28 may include the device of example 21 and/or some other example herein, wherein the active layer comprises an atomic concentration of 5 to 10 percent indium, an atomic concentration of 20 to 25 percent indium, or an atomic concentration of 30 to 40 percent indium.

Example 29 may include the device of example 21 and/or some other example herein, wherein the core and the cladding are doped with opposite type dopants.

Example 30 may include the device of example 21 and/or some other example herein, wherein the core comprises a nanopillar.

Example 31 may include a device comprising an integrated circuit (IC) structure comprising: a substrate comprising a metal and oxygen; a first core, a second core, and a third core over the substrate, the cores comprising a group III semiconductor material, the cores doped with n-type dopants; a first active layer on a surface of the first core, the first active layer comprising a first atomic concentration of indium; a second active layer on a surface of the second core, the second active layer comprising a second atomic concentration of indium; a third active layer on a surface of the third core, the third active layer comprising a third atomic concentration of indium; and a cladding on the first, second, and third active layers, the cladding doped with p-type dopants.

Example 32 may include the device of example 31 and/or some other example herein, further comprising an isolation structure electrically isolating the individual cores.

Example 33 may include the device of example 31 and/or some other example herein, wherein the substrate comprises gallium.

The Example 34 may include the device of example 31 and/or some other example herein, wherein the first atomic concentration of indium comprises an atomic concentration of 5 to 10 percent indium, the second atomic concentration of indium comprises an atomic concentration of 20 to 25 percent indium, and the third atomic concentration of indium comprises an atomic concentration of 30 to 40 percent indium.

Example 35 may include the device of example 31 and/or some other example herein, wherein the first, second, and third cores comprise gallium and nitrogen.

Example 36 may include the device of example 31 and/or some other example herein, further comprising a fourth core over the substrate.

Example 37 may include the device of example 36 and/or some other example herein, further comprising a fourth active layer on a surface of the fourth core, the fourth active layer comprising a fourth atomic concentration of indium.

Example 38 may include a method for fabricating a device comprising an integrated circuit (IC) structure, the method comprising: forming a substrate comprising a metal and oxygen; forming a core over the substrate, the core comprising a group III semiconductor material and nitrogen, the core doped with n-type dopants; forming an active layer on a surface of the core, the active layer comprising indium; and forming a cladding on the active layer, the cladding doped with p-type dopants.

Example 39 may include the method of example 38 and/or some other example herein, wherein the substrate comprises gallium.

Example 40 may include the method of example 38 and/or some other example herein, further comprising forming a semiconductor layer between the substrate and the core.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

While the disclosure includes various embodiments, including at least a best mode, it is to be understood that many alternatives, modifications, and variations will be apparent to those skilled in the art in light of the foregoing description. Accordingly, the disclosure is intended to embrace all such alternatives, modifications, and variations, which fall within the scope of the included claims. All matters disclosed herein or shown in the accompanying drawings are to be interpreted in an illustrative and non-limiting sense.

This written description uses examples to disclose certain embodiments of the disclosure, including the best mode, and also to enable any person skilled in the art to practice certain embodiments of the disclosure, including making and using any apparatus, devices or systems and performing any incorporated methods and processes. The patentable scope of certain embodiments of the disclosure is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An integrated circuit (IC) structure comprising:
   a substrate comprising a metal and oxygen;
   a first core, a second core, and a third core over the substrate, the cores comprising a group III semiconductor material, the cores doped with n-type dopants;
   a first active layer on a surface of the first core, the first active layer comprising a first atomic concentration of indium;
   a second active layer on a surface of the second core, the second active layer comprising a second atomic concentration of indium;
   a third active layer on a surface of the third core, the third active layer comprising a third atomic concentration of indium; and
   a cladding on the first, second, and third active layers, the cladding doped with p-type dopants.

2. The structure of claim 1, further comprising an isolation structure electrically isolating the individual cores.

3. The structure of claim 1, wherein the substrate comprises gallium.

4. The structure of claim 1, wherein the first atomic concentration of indium comprises an atomic concentration of 5 to 10 percent indium, the second atomic concentration of indium comprises an atomic concentration of 20 to 25 percent indium, and the third atomic concentration of indium comprises an atomic concentration of 30 to 40 percent indium.

5. The structure of claim 1, wherein the first, second, and third cores comprise gallium and nitrogen.

6. The structure of claim 1, further comprising a fourth core over the substrate.

7. The structure of claim 6, further comprising a fourth active layer on a surface of the fourth core, the fourth active layer comprising a fourth atomic concentration of indium.

8. An integrated circuit (IC) structure, comprising:
   a substrate with a {111} orientated crystalline structure comprising gallium and oxygen;
   a dielectric material over the substrate;
   a first core, a second core, and a third core extending through the dielectric material, the first, second and third cores each comprising a group III semiconductor material;
   a first active layer on a surface of the first core, the first active layer comprising a first atomic concentration of indium;
   a second active layer on a surface of the second core, the second active layer comprising a second atomic concentration of indium;
   a third active layer on a surface of the third core, the third active layer comprising a third atomic concentration of indium; and
   a cladding on the first, second, and third active layers, wherein at least one of the cladding, the first active layer, the second active layer, or the third active layer extends laterally over the dielectric material.

9. The IC structure of claim 8, wherein each of the cladding, first active layer, second active layer, and third active layer extends laterally over the dielectric material.

10. The IC structure of claim 9, wherein a first portion of a sidewall of the first, second, and third cores is adjacent to the dielectric material, and wherein:
    the first active layer is adjacent to a second portion of the sidewall of the first core;
    the second active layer is adjacent to a second portion of the sidewall of the second core; and
    the third active layer is adjacent to a second portion of the sidewall of the third core.

11. The IC structure of claim 8, wherein the second portion of the sidewall of the first core extends laterally over the dielectric material.

12. The IC structure of claim 11, wherein the surface of the first, second and third core are pyramidal with a plurality of intersecting sidewall surfaces.

13. The IC structure of claim 8, further comprising a buffer material between the dielectric material and the substrate, wherein the buffer material comprises a group III-N material, and wherein the group III semiconductor of at least one of the first, second or third cores further comprises nitrogen, has hexagonal crystalline structure, and is over the buffer material.

14. The IC structure of claim 8, further comprising a first contact on a side of the substrate opposite the cladding layer.

15. The IC structure of claim 14, wherein the first contact is electrically coupled to the first, second and third cores through the substrate.

16. The IC structure of claim 14, further comprising a plurality of second contacts in contact with the cladding layer, wherein a first of the second contacts is in contact with the cladding layer over the first active layer, a second of the second contacts is in contact with the cladding layer over the second active layer, and a third of the second contacts is in contact with the cladding layer over the third active layer.

17. The IC structure of claim 8, wherein each of the first active layer, second active layer, and third active layer further comprises Ga and N.

* * * * *